(12) United States Patent
Chen et al.

(10) Patent No.: US 11,482,511 B2
(45) Date of Patent: Oct. 25, 2022

(54) LIGHTING DEVICE AND METHOD OF MANUFACTURING THE SAME

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 89 days.

(21) Appl. No.: 16/914,451

(22) Filed: Jun. 28, 2020

(65) Prior Publication Data

US 2021/0013186 A1    Jan. 14, 2021

(30) Foreign Application Priority Data

Jul. 9, 2019   (CN) .......................... 201910615934.9

(51) Int. Cl.
   *H01L 25/075*    (2006.01)
   *H01L 33/00*    (2010.01)

(52) U.S. Cl.
   CPC ...... *H01L 25/0753* (2013.01); *H01L 33/0095* (2013.01); *H01L 2933/0066* (2013.01)

(58) Field of Classification Search
   CPC combination set(s) only.
   See application file for complete search history.

(56) References Cited

U.S. PATENT DOCUMENTS

| | | | |
|---|---|---|---|
| 2017/0316737 A1* | 11/2017 | Park | G09G 3/3208 |
| 2018/0122837 A1 | 5/2018 | Kang | |
| 2018/0175268 A1 | 6/2018 | Moon | |
| 2018/0188606 A1 | 7/2018 | Lee | |
| 2018/0190631 A1 | 7/2018 | Kim | |
| 2018/0190747 A1* | 7/2018 | Son | G06F 3/1423 |
| 2018/0323116 A1* | 11/2018 | Wu | H01L 25/0753 |
| 2020/0295300 A1* | 9/2020 | Chung | H01L 51/5225 |
| 2020/0350464 A1* | 11/2020 | Shin | H01L 25/167 |

* cited by examiner

Primary Examiner — Ratisha Mehta
(74) Attorney, Agent, or Firm — Winston Hsu

(57) ABSTRACT

A lighting device and a related manufacturing method are provided. The lighting device includes a substrate and at least one lighting unit formed on the substrate. The lighting unit includes an accommodating hole and a first light emitting diode spaced apart from the accommodating hole. The accommodating hole is for a second light emitting diode.

11 Claims, 18 Drawing Sheets

LIGHTING DEVICE AND METHOD OF MANUFACTURING THE SAME

BACKGROUND OF THE DISCLOSURE

1. Field of the Disclosure

The present disclosure is related to a lighting device and a manufacturing method thereof, and more particular to a lighting device including a repairing line and a fabrication method thereof.

2. Description of the Prior Art

In recent years, with the advancement of science and technology, information products have become indispensable daily necessities. The key components of information products include display devices, light source devices and/or various lighting devices that can generate light. When the integration of the elements in the lighting device is high, the manufacturing difficulty is also relatively high. Therefore, how to improve the yield rate of the lighting devices is still an important issue, and the industry needs continuous efforts.

SUMMARY OF THE DISCLOSURE

One of the objectives of the present disclosure is to provide a lighting device and related manufacturing method. According to the structure of the lighting device and the related manufacturing method of the present disclosure, the defective lighting unit can be repaired more effectively, so as to improve the manufacture yield.

An embodiment of the present disclosure provides a lighting device including a substrate and at least one lighting unit disposed on the substrate. The lighting unit includes an accommodating hole and a first light emitting diode. The first light emitting diode is separated from the accommodating hole, and the accommodating hole is for a second light emitting diode.

An embodiment of the present disclosure further provides a method of manufacturing a lighting device. The method includes providing a substrate, forming a circuit layer on the substrate, forming an accommodating hole of a lighting unit, and forming a first light emitting diode of the lighting unit. Wherein, the accommodating hole is for a second light emitting diode, and the accommodating hole is separated from the first light emitting diode.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. For purposes of illustrative clarity understood, various drawings of this disclosure show a portion of the electronic device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to". When the term "comprises", "include" and/or "have" are used in this document, it refers to the existence of the said feature, region, step, operation and/or component, but the existence or addition of one or more other features, regions, steps, operations and/or components is not excluded.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It will be understood that when an element or layer is referred to as being "on," "connected to" or "coupled to" another element or layer, it may directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The technical features in different embodiments described in the following can be replaced, recombined, or mixed with one another to constitute another embodiment without departing from the spirit of the present disclosure.

Figure 1:
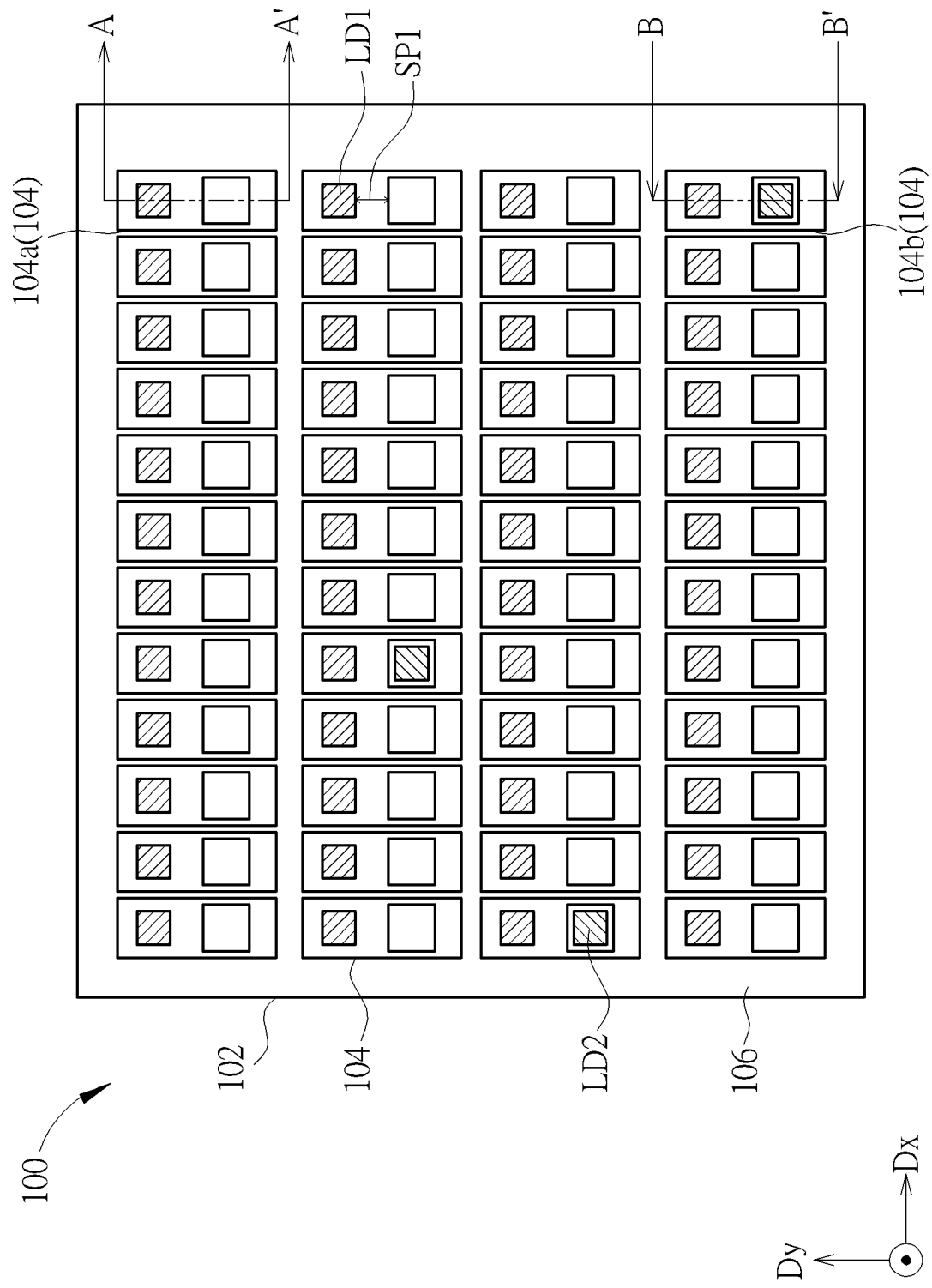
FIG. 1 is a schematic top-view diagram of a lighting device according to a first embodiment of the present disclosure.
Figure 2:
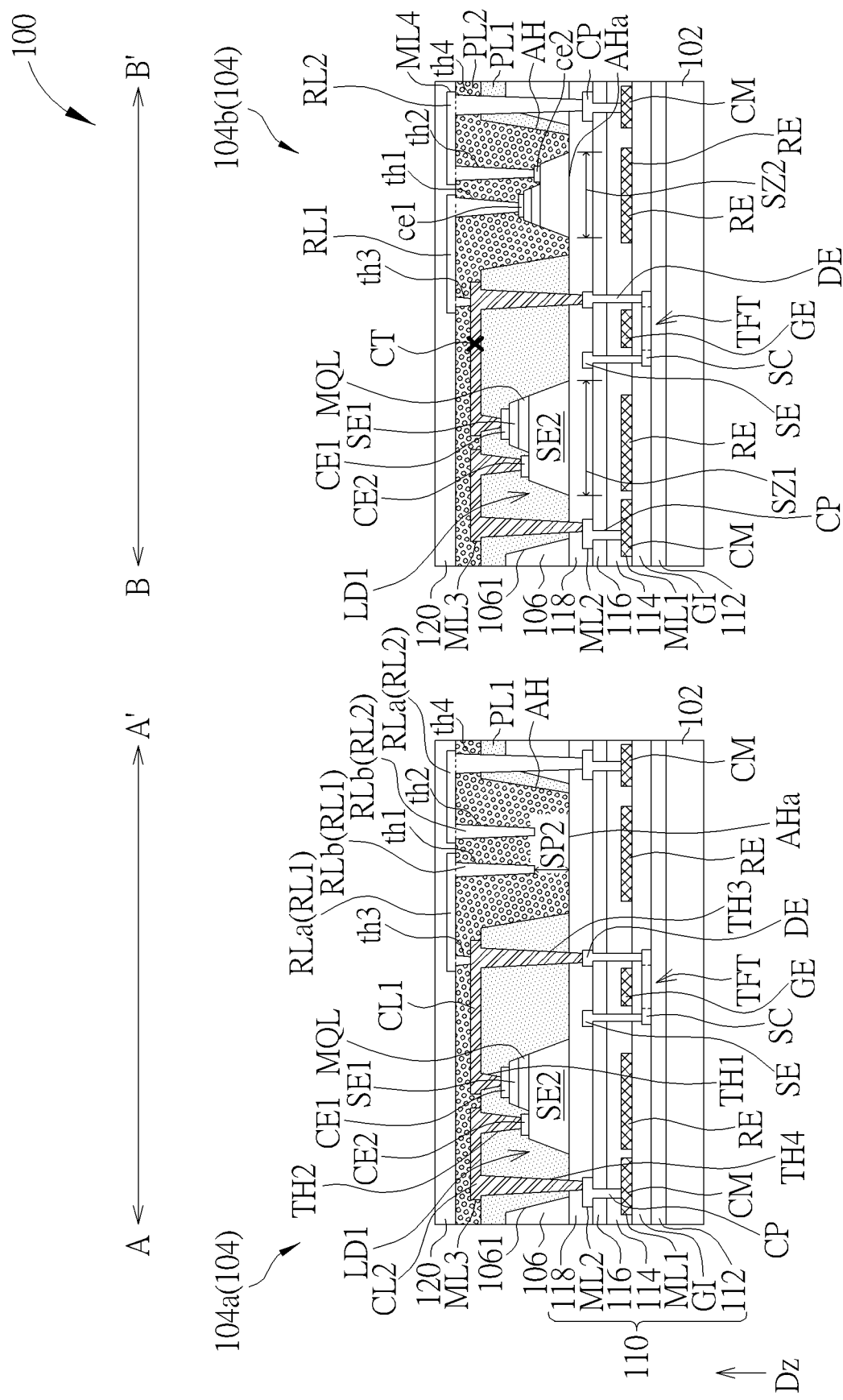
FIG. 2 is a schematic partial cross-sectional view along a sectional-line A-A' and a sectional-line B-B' of the lighting device shown in FIG. 1.

Referring to FIG. 1 and FIG. 2, FIG. 1 is a schematic top-view diagram of a lighting device according to a first embodiment of the present disclosure, and FIG. 2 is a schematic partial cross-sectional view along sectional-line A-A' and sectional-line B-B' of the lighting device shown in FIG. 1. The lighting device 100 according to the first embodiment of the present disclosure may be a light source device, a display device, a backlight device, a sensing device, or a tile device, but not limited thereto. The lighting device may be a foldable lighting device or a flexible lighting device. The lighting device for example may include light emitting diodes, such as inorganic light emitting diodes (iLEDs), organic light emitting diodes (OLED), mini-meter-sized light emitting diodes (mini LED), micrometer-sized light emitting diodes (micro LEDs), or quantum dot (QD) light emitting diodes (such as QLED and QDLED), and may include fluorescence, phosphor, or other suitable materials, wherein the materials can be arranged and combined arbitrarily, and the materials are not limited thereto. The tile device may be for example a tile lighting device, but not limited thereto. It should be noted that the lighting device may be a combination of any of the above-mentioned devices, but not limited thereto. A lighting device or a tile device will be taken as the display device for illustration and explanation of the present disclosure hereinafter, but the present disclosure is not limited thereto. Furthermore, the lighting device 100 may be applied to any electronic product or electronic device that needs a light source or a light emitting component, such as (but not limited to) a television, a tablet computer, a notebook computer, a mobile phone, a camera, a wearable device, electronic entertainment device, etc. As an example, the lighting device 100 includes a display device in this embodiment, wherein the display device can generate lights with different colors to display colorful images, but not limited thereto.

The lighting device 100 includes a substrate 102 and at least one lighting unit 104 disposed on (or formed on) the substrate 102. The lighting device 100 shown in FIG. 1 includes a plurality of lighting units 104 arranged along a horizontal direction Dx and a vertical direction Dy as an array. As shown in FIG. 2, the area of the lighting unit 104 may be defined by the opening 1061 of a pixel defining layer 106, but not limited thereto. The lighting unit 104 includes a first light emitting diode LD1 for emitting light. The first light emitting diode LD1 may be an inorganic light emitting diode (iLED), an organic light emitting diode (organic light emitting diode, OLED) or other suitable types of light emitting diodes or light emitting elements. For example, the first light emitting diode LD1 of this embodiment may adopt an inorganic light emitting diode, which may be a mini LED or a micro LED, but not limited thereto. As an example, the first light emitting diode LD1 may include a first electrode CE1, a second electrode CE2, a first semiconductor layer SE1, a second semiconductor layer SE2, and a multi quantum well (MQW) layer MQL disposed between the first semiconductor layer SE1 and the second semiconductor layer SE2. The first semiconductor layer SE1, the second semiconductor layer SE2, and the multi quantum well layer MQL may compose a p-n diode, wherein the first semiconductor layer SE1 is a p-type semiconductor layer, and the second semiconductor layer SE2 is an n-type semiconductor layer, or vice versa. The first light emitting diode LD1 shown in FIG. 1 is a lateral-type light emitting diode, and the first electrode CE1 and the second electrode CE2 are both at the top surface of the first light emitting diode LD1. However, the type of the first light emitting diode LD1 of the present disclosure is not limited to the above-mentioned structure, and other types of light emitting diode (such as a vertical-type light emitting diode or a flip-chip light emitting diode) may be adopted in the present disclosure. According to the present disclosure, the first light emitting diodes LD1 in the plurality of lighting units 104 may be the same type or different types of light emitting diodes. For example, the first light emitting diodes LD1 in different lighting units 104 may be the light emitting diodes that can produce the same color light, such as (but not limited) white light emitting diodes, blue light emitting diodes, or ultraviolet light emitting diodes. In some embodiments, the lighting units 104 may further include light conversion material (such as quantum dot materials) disposed on the light emitting diodes. When all the first light emitting diodes LD1 are blue light emitting diodes or ultraviolet light emitting diodes, different light conversion materials may be disposed in different lighting units 104 such that the plural lighting units 104 can emit light with different colors, such as blue light, green light, and red light, but not limited thereto. As an example, some of the lighting units 104 may produce yellow light in a variant embodiment. In addition, in some embodiments, the first light emitting diodes LD1 indifferent lighting unit 104s may be light emitting diodes producing different color lights respectively. For example, three adjacent lighting units 104 may include a blue light emitting diode, a red light emitting diode, and a green light emitting diode respectively, wherein each of the three lighting units 104 may serve as a sub-pixel of the display device and the three adjacent light units 104 can compose a pixel jointly. In some embodiments, four lighting units 104 include red light emitting diode, green light emitting diode, blue light emitting diode, and white light emitting diode respectively may be designed as a group to compose a pixel jointly. However, the present disclosure is not limited to the above-mentioned structure, and any suitable composition of sub-pixels can be applied to the present disclosure. The lighting units 104 of this embodiment further comprises an accommodating hole AH respectively, wherein each accommodating hole AH is disposed at a side of the first light emitting diode LD1 in the same lighting unit 104, and the first light emitting diode LD1 and the accommodating hole AH in the same lighting unit 104 are arranged adjacent to each other and separate from each other. In the same lighting unit 104, the first light emitting diode LD1 can be separated from the accommodating hole AH. In other words, the first light emitting diode LD1 and the accommodating hole AH have a space distance existing therebetween, which is represented as the spacing SP1.

According to the present disclosure, the accommodating hole AH may be used for disposing a second light emitting diode LD2. Specifically, there is no second light emitting diode LD2 disposed in the accommodating holes AH of some of the lighting units 104 of the lighting device 100, but some accommodating holes AH in other lighting units 104 may have the second light emitting diodes LD2 disposed therein. The lighting unit 104a and the lighting unit 104b respectively illustrate the above two situations in FIG. 1, wherein the partial enlargement schematic diagram of cross-sectional view of the lighting unit 104a and the lighting unit 104b are depicted in FIG. 2. In the lighting unit 104b, a second light emitting diode LD2 is disposed in the accommodating hole AH, wherein the second light emitting diode LD2 may have the same type or different type from the type of the first light emitting diode LD1. The second light emitting diode LD2 shown in FIG. 2 is a lateral-type light emitting diode as an example and has a first electrode ce1 and a second electrode ce2 disposed at the top surface of the second light emitting diode LD2, but not limited thereto. The size of the second light emitting diode LD2 may be greater than, smaller than, or equal to the size of the first light emitting diode LD1. In some embodiments, the size of the second light emitting diode LD2 is smaller than or equal to the size of the first light emitting diode LD1. In FIG. 2, the size of the second light emitting diode LD2 is smaller than that of the first light emitting diode LD1 as an example, wherein the size SZ1 (represented by the lateral width in the cross-sectional view diagram) of the first light emitting diode LD1 is greater than the size SZ2 (represented by the lateral width in the cross-sectional view diagram) of the second light emitting diode LD2, but not limited thereto. The ratio of the size (or area) of the second light emitting diode LD2 to the size (or area) of the first light emitting diode LD1 for example is in a range from greater than or equal to 0.1 to less than or equal to 1, but not limited thereto.

Furthermore, the lighting device 100 may include a first planarization layer PL1. A portion of the first planarization layer PL1 covers the first light emitting diode LD1, and a portion of the first planarization layer PL1 is formed in the opening 1061 of the pixel defining layer 106. The first planarization layer PL1 may serve as a protective layer to protect the circuit layer and the first light emitting diode LD1. The first planarization layer PL1 may include organic insulating layer, such as perfluoroalkoxy alkane (PFA), epoxy, or other resin materials, but not limited thereto. In other embodiments, the first planarization layer PL1 may include inorganic insulating material (s), such as silicon oxide (SiOx), silicon nitride (SiNx), aluminum oxide (AlOx), or silicon oxynitride (SiOxNy), but not limited thereto. The accommodating hole AH is disposed in the first planarization layer PL1. For example, the first planarization layer PL1 includes an accommodating hole AH respectively in the lighting unit 104a and the lighting unit 104b. Furthermore, a first conductive line CL1 and a second conductive line CL2 may be disposed on the first planarization layer PL1 to be electrically connected to the first electrode CE1 and the second electrode CE2 of the first light emitting diode LD1 directly or indirectly via the through hole TH1 and the through hole TH2 in the first planarization layer PL1 respectively. The first conductive line CL1 and the second conductive line CL2 may further be electrically connected to the electrical element(s) below the first light emitting diode LD1 via the through hole TH3 and through hole TH4 in the first planarization layer PL1 respectively. The first conductive line CL1 and the second conductive line CL2 may be formed by a same conductive layer. Furthermore, in the accommodating hole AH of the lighting unit 104b, a second light emitting diode LD2 is disposed, while there is no light emitting diode disposed in the accommodating hole AH of the lighting unit 104a. In addition, the lighting device 100 may further include a second planarization layer PL2. A portion of the second planarization layer PL2 can cover the first planarization layer PL1, and a portion of the second planarization layer PL2 can be filled into the accommodating hole AH to cover the second light emitting diode LD2. The second planarization layer PL2 may serve as a protective layer to protect the second light emitting diode LD2. The second planarization layer PL2 may include organic insulating material or inorganic insulating material, which may be the same or different from the material of the first planarization layer PL1. The second planarization layer PL2 may include a material with protection function, such as with high hardness or water/oxygen-resistance, such that the second planarization layer PL2 may be called as a protective layer.

The lighting device 100 may further include a first repairing line RL1 and a second repairing line RL2 formed on the second planarization layer PL2. At least a portion RLa of the first repairing line RL1 and the second repairing line RL2 can be located on a surface of the second planarization layer PL2 and can at least partially overlap the corresponding accommodating hole AH in the thickness direction Dz of the substrate 102. In other words, the projection area on the surface of the substrate 102 of the portion RLa at least partially overlaps the projection area on the surface of the substrate 102 of the accommodating holes AH. The other portion RLb of the first repairing line RLa and the second repairing line RLb can pass through the through hole th1 and the through hole th2 to extend in the second planarization layer PL2 in the thickness direction Dz of the substrate 102. The thickness direction Dz may be a direction normal to the plane of the substrate 102 or a direction in which the substrate 102 is viewed from the top. In detail, in the lighting unit 104a, the portion RLb of the first repairing line RL1 and the second repairing line RL2 may extend within the second planarization layer PL2 in the accommodating hole AH along a direction Dz parallel to a direction of the thickness of the substrate 102 (parallel to the thickness direction of the substrate 102), but the first repairing line RL1 and the second repairing line RL2 do not contact the bottom surface AHa of the accommodating hole AH. That is, the first repairing line RL1 and the second repairing line RL2 have a spacing SP2 with the bottom surface AHa of the accommodating hole AH. For example, the spacing SP2 may be greater than or equal to 0.1 micrometers (μm) to less than or equal to 5 micrometers (μm), but not limited thereto. This design can reduce the probability of the generation of additional leakage path. In another aspect, the first repairing line RL1 and the second repairing line RL2 in the lighting unit 104b are electrically connected to the first electrode ce1 and the second electrode ce2 of the second light emitting diode LD2 through the through hole th1 and the through hole th2, respectively. In addition, the first repairing line RL1 can be electrically connected to the first conductive line CL1 through the through hole th3 in the second planarization layer PL2, and the second repairing line RL2 can be electrically connected to the electrical element(s) below the accommodating hole AH through the through hole th4, wherein the through hole th4 may be formed in the second planarization layer PL2, the first planarization layer PL1, the pixel defining layer 106, and/or other insulating layers. It should be noted that the side walls of the portion RLb of the first repairing line RL1 and the second repairing line RL2 contacting the through holes may be at least partially an inclined surface or a gentle slope.

According to the present disclosure, the second light emitting diode LD2 can be used for replacing or substituting the first light emitting diode LD1 that is failed (abnormal light emission or unable to emit light), so that the lighting unit 104 can emit light normally to complete the repair procedure. In other words, the second light emitting diode LD2 can be used for repairing the first light emitting diode LD1. The abnormal light emission may be, for example, the chromaticity and/or brightness of the light emitted by the light emitting diode does not meet the requirements, or the emitted light abnormally flickers, etc. For example, in the process of manufacturing the lighting device 100, when the first light emitting diode LD1 in the lighting unit 104b is found to be unable to effectively provide a light-emitting function or emits light abnormally, the second light emitting diode LD2 can be disposed in the accommodating hole AH of the lighting unit 104b. By electrically connecting the second light emitting diode LD2 to the corresponding switching element through the first repairing line ce1 and the second repairing line ce2 and electrically isolating the defective first light emitting diode LD1 in the lighting unit 104b from the switching element therebelow, the second light emitting diode LD2 can replace or substitute the first light emitting diode LD1 to provide a light-emitting function. In addition, the lighting device 100 may further include a protective layer 120 covering the first repairing line RL1, the second repairing line RL2, and the second planarization layer PL2. The protective layer 120 may include an inorganic material, such as silicon oxide, silicon nitride, aluminum oxide, or silicon oxynitride, but not limited thereto. The protective layer 120 may also include an organic material, such as PFA material.

The lighting device 100 may further include a circuit layer 110 formed on the surface of the substrate 102. The circuit layer 110 may include a plurality of wires and various electrical elements, such as switching elements, driving elements, conductive lines (such as gate scanning lines, data signal lines, common electrode lines, power lines, etc.), and/or capacitors, but not limited thereto. For example, the lighting device 100 may be an active display device, and the circuit layer 110 may include a thin film transistor TFT, which includes a gate electrode GE, a source electrode SE, a drain electrode DE, and a semiconductor layer SC. The gate insulating layer GI separates the gate electrode GE and the semiconductor layer SC. The thin film transistor TFT can be used as the switching element or driving element of the light emitting diode. In the lighting unit 104a, the drain electrode DE of the thin film transistor TFT may be electrically connected to the first electrode CE1 of the first light emitting diode LD1 through the first conductive line CL1. In the lighting unit 104b, the drain electrode DE of the thin film transistor TFT can be electrically connected to the first electrode ce1 of the second light emitting diode LD2 through the first repairing line RL1, and the thin film transistor TFT and the first light emitting diode LD1 can be electrically isolated through an electrical isolation process (such as an open process) CT. In addition, the source electrode SE of the thin film transistor TFT can be electrically connected to the signal line, and the gate electrode GE can be electrically connected to the scan line, but not limited thereto.

The circuit layer 110 may further include common electrode lines CM (also referred to as common electrodes) connected to a common voltage source or an operating voltage source, and each common electrode line CM may be electrically connected to the second electrode CE2 of a corresponding first light emitting diode LD1 or the second electrode ce2 of a corresponding second light emitting diode LD2 through a connection element or a connection electrode CP. The circuit layer 110 may optionally further include a reflective electrode RE disposed under the first light emitting diode LD1 and the accommodating hole AH. The reflective electrode RE may be selected as a floating state, being electrically connected to a common electrode, or grounded. The reflective electrode RE serves as a reflective plate to provide the function of reflecting light produced by the light emitting diode. In some embodiments, the gate electrode DE, the reflective electrode RE, and the common electrode line CM may be composed of the same conductive layer, which is represented by the first conductive layer ML1 in FIG. 2. The source electrode SE, the drain electrode DE, and the connection electrode CP may be composed of the same conductive layer, which is represented by a second conductive layer ML2 in FIG. 2. The first conductive layer ML1 and the second conductive layer ML2 are respectively a metal layer, but not limited thereto. In addition, the circuit layer 110 may further include a buffer layer 112 disposed between the substrate 102 and the semiconductor layer SC, a first insulating layer 114 covering the first conductive layer ML1, a second insulating layer 116 selectively disposed on the first insulating layer 114, and a third insulating layer 118 selectively disposed on the second conductive layer ML2. The first insulating layer 114, the second insulating layer 116, and the third insulating layer 118 may serve as a passivation layer or a protective layer respectively, and may include an inorganic material or an organic material, but are not limited thereto. The circuit layer 110 may include a buffer layer 112 for lattice matching or protection of the substrate 102 and each layer of the circuit layer. The material of the buffer layer 112 may include an inorganic insulating material, an organic insulating material, or a combination thereof.

Figure 3:
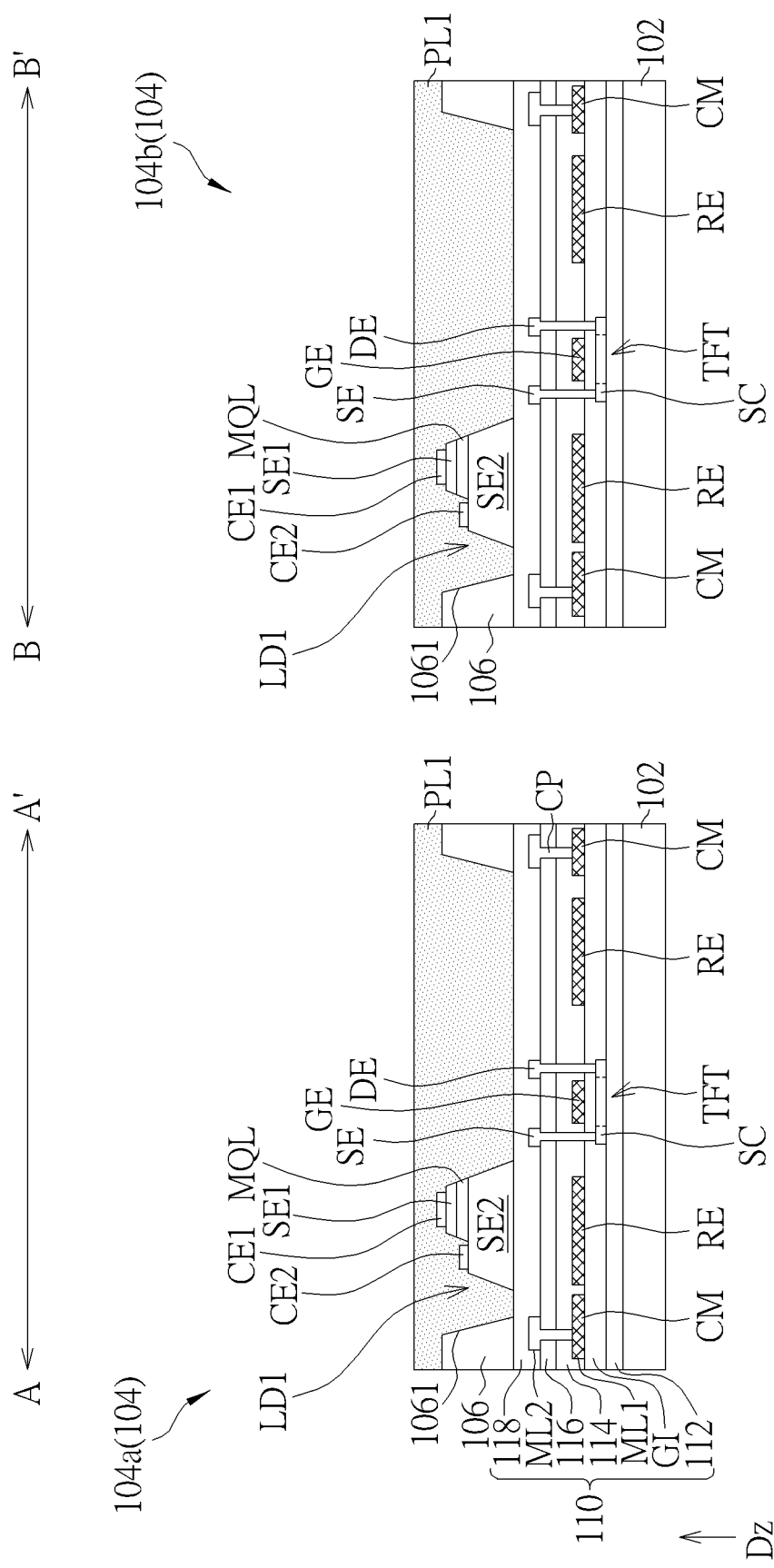
FIG. 3 to FIG. 6 are schematic diagrams showing the fabrication processes of the manufacturing method of the lighting device according to the first embodiment of the present disclosure.
Figure 5:
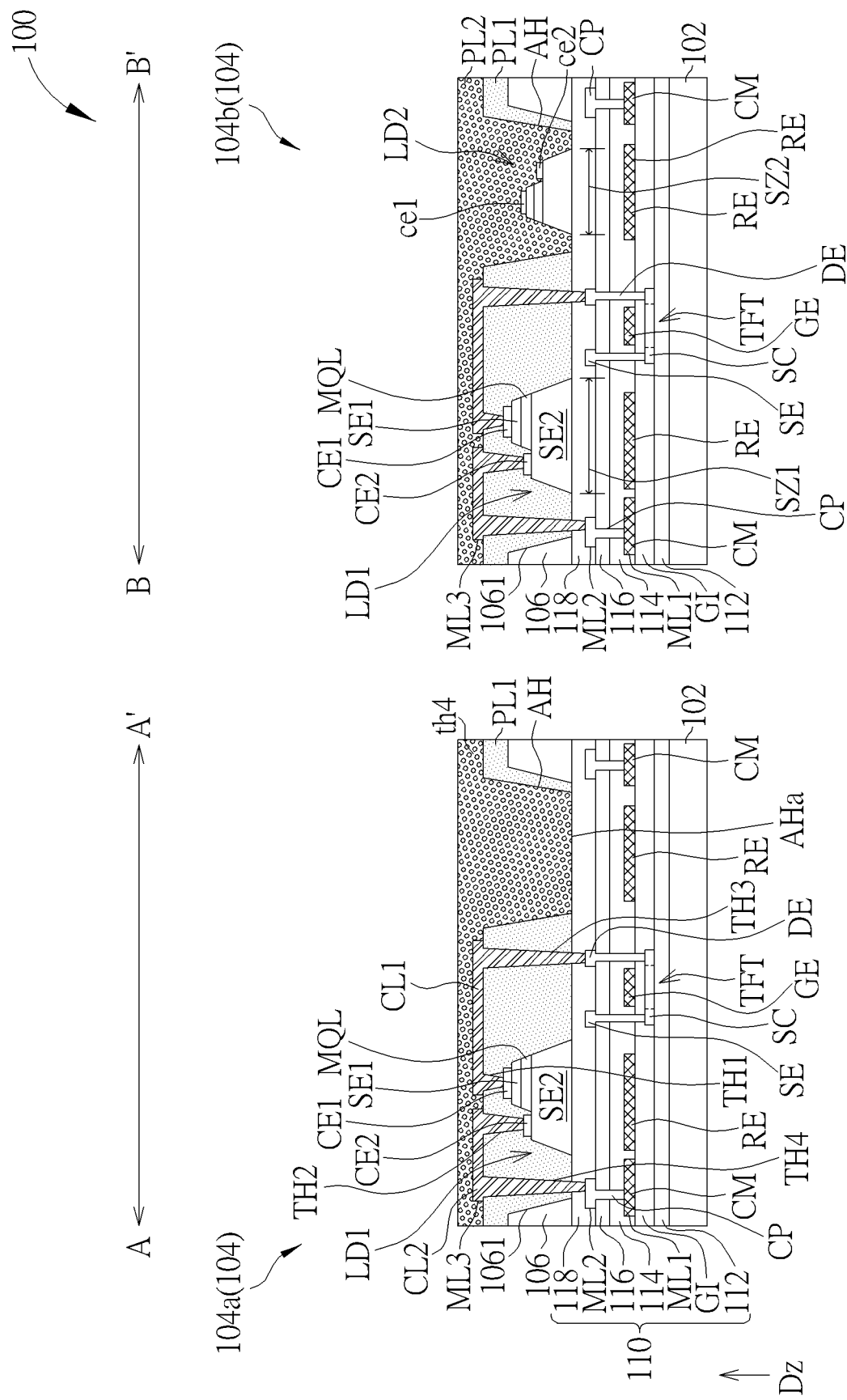
Figure 6:
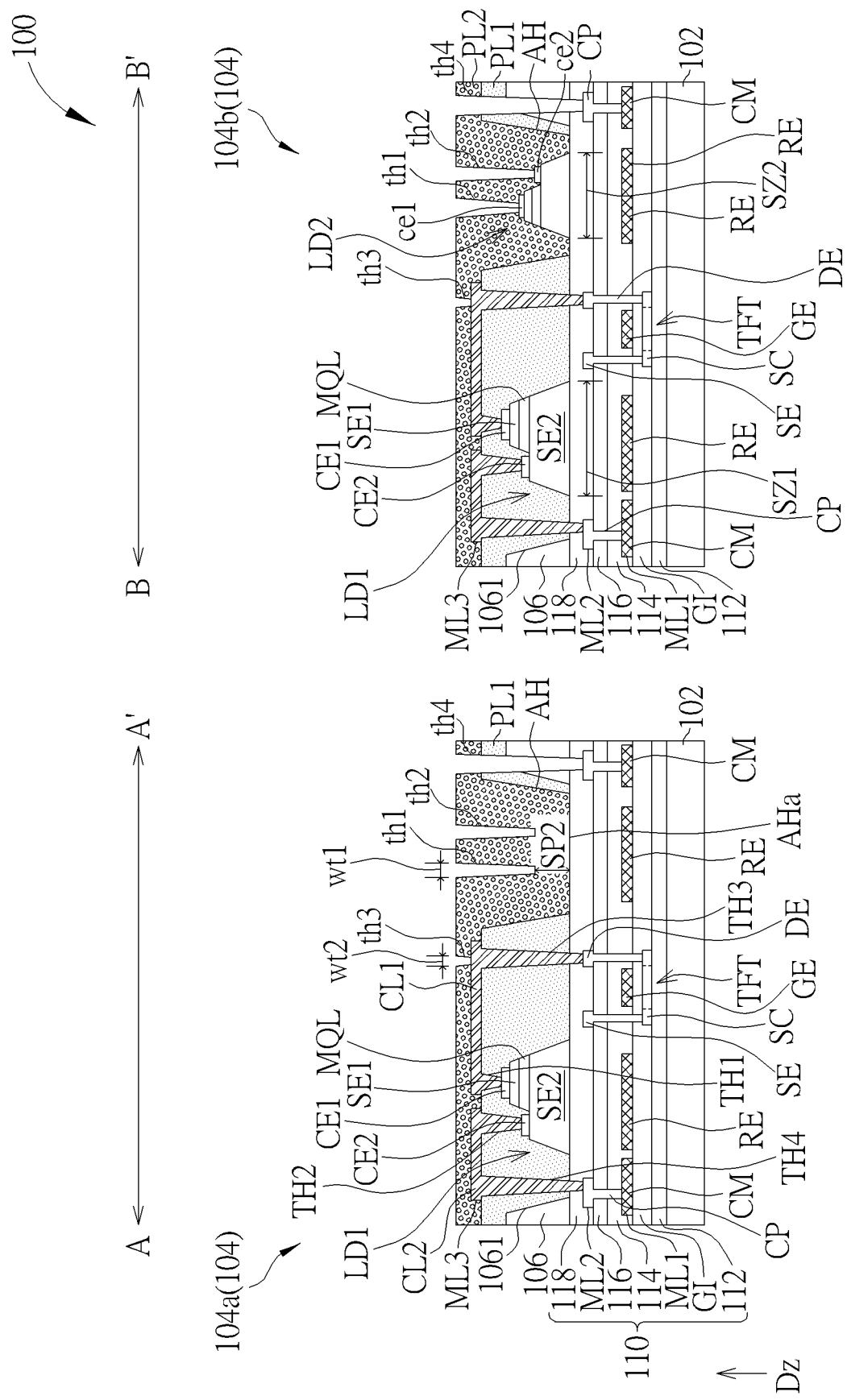
Figure 7:
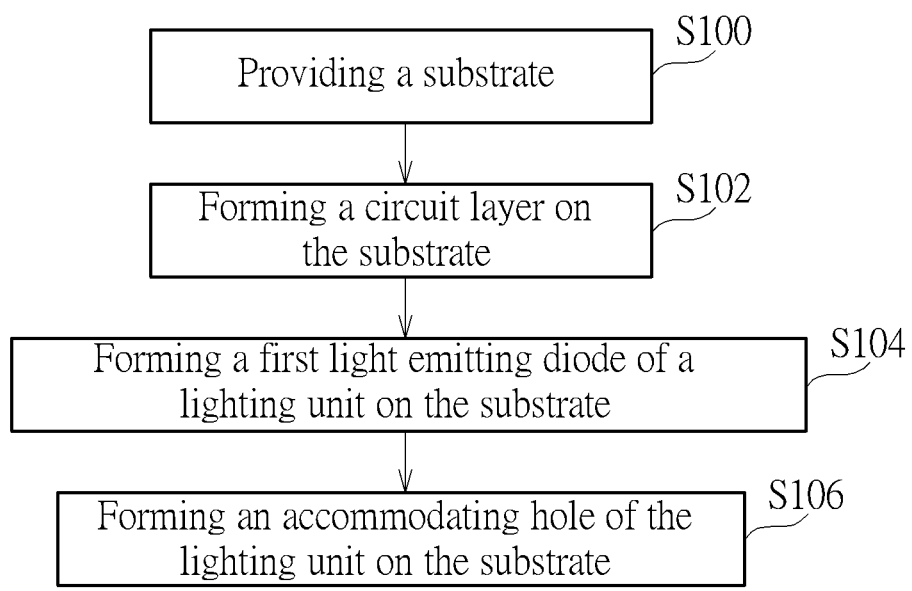
FIG. 7 is a block flowchart of the manufacturing method of a lighting device according to the first embodiment of the present disclosure.

Please refer to FIG. 3 to FIG. 7, wherein FIG. 3 to FIG. 6 are schematic diagrams of processes of the manufacturing method of the lighting device according to the first embodiment of the present disclosure, which depict the cross-sectional view diagrams of the lighting unit 104a and the lighting unit 104b respectively corresponding to the cross-sectional line AA' and the cross-sectional line B-B' of FIG. 1, and FIG. 7 is a block flowchart of the manufacturing method of a lighting device according to the first embodiment of the present disclosure. As shown in FIG. 3 and FIG. 7, the manufacturing method of the lighting device of the first embodiment of the present disclosure includes performing step S100 to first provide a substrate 102. The substrate 102 may be a rigid substrate or a flexible substrate. For example, the material of the substrate 102 may include glass, quartz, sapphire, polyimide (PI), polycarbonate (PC), or polyethylene terephthalate (PET), or a combination of the foregoing, but not limited thereto. Next, step S102 is performed to form a circuit layer 110 on the substrate 102. The circuit layer 110 may include a plurality of conductive lines or wires and various electrical elements as described above, and details are not described herein repeatedly. An example of the formation of the circuit layer 110 is to sequentially form the buffer layer 112, the semiconductor layer SC, the gate insulating layer GI, the first conductive layer ML1, the first insulating layer 114, and the optional second insulating layer 116, and then through holes are formed in the first insulating layer 114 and the second insulating layer 116. The second conductive layer ML2 is following formed, so that a portion of the second conductive layer ML2 is filled in the through holes, and finally the third insulating layer 118 is formed. An adhesive layer can be selectively formed on the third insulating layer 118. Then, a pixel defining layer 106 can be selectively formed on the circuit layer 110, wherein the opening 1061 of the pixel defining layer 106 can define the range of the lighting unit 104a and the lighting unit 104b.

Then, step S104 is performed to dispose the first light emitting diodes LD1 of the lighting unit 104a and the lighting unit 104b on the substrate 102. When the first light emitting diodes LD1 are inorganic light emitting diodes, a plurality of first light emitting diodes LD1 can be transferred to the openings 1061 of the lighting units 104 at the same time by adopting a mass transfer method. For example, an adhesive layer on the third insulating layer 118 may be used for fixing the first light emitting diodes LD1 on the third insulating layer 118. In some embodiments, the first light emitting diodes LD1 may be fixed on the third insulating layer 118 by using a molten metal. In some other embodiments, the third insulating layer 118 itself may be adhesive to fix the first light emitting diodes LD1.

Figure 4:
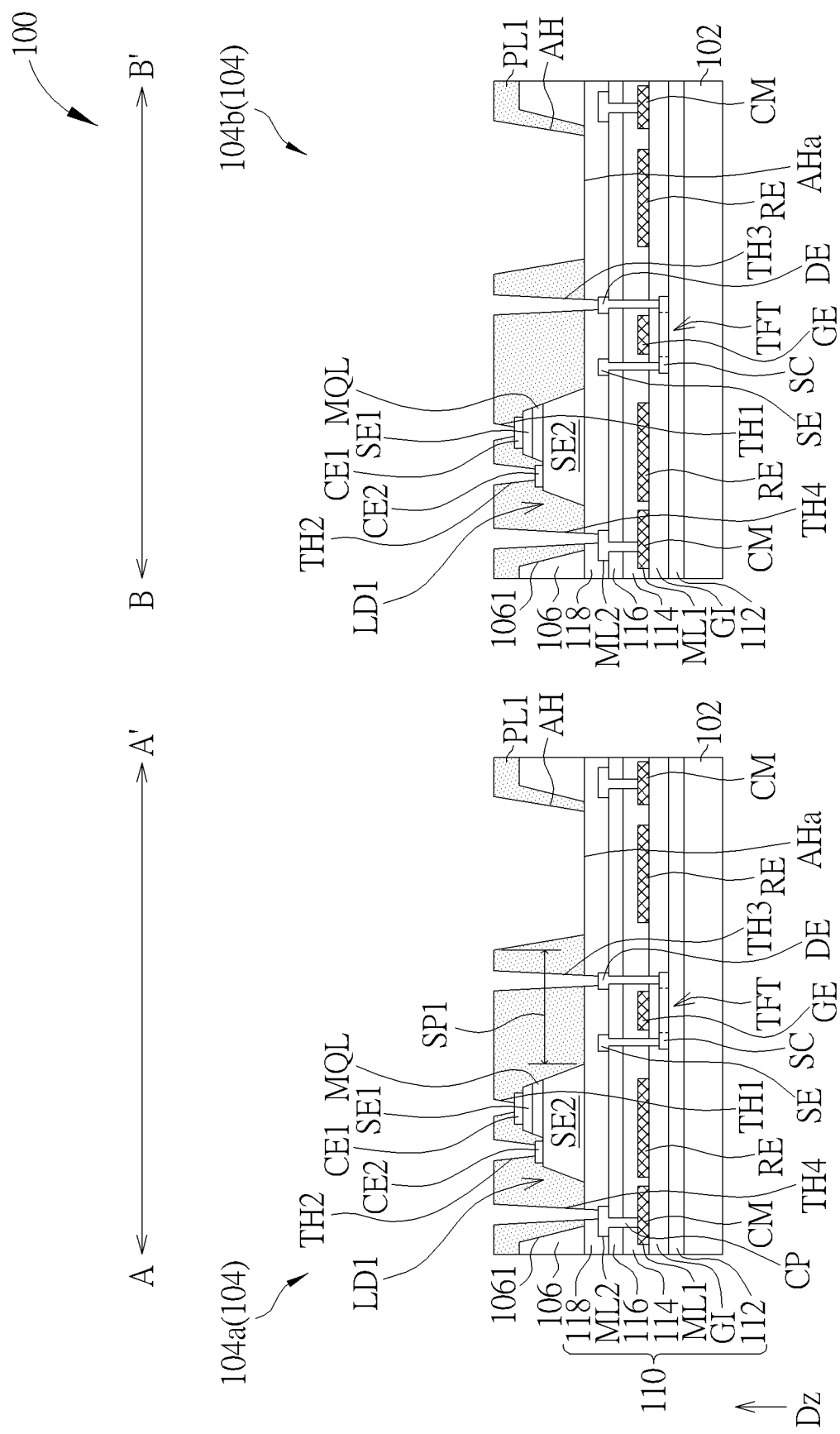

Next, step S106 is performed to form the accommodating holes AH of the lighting units 104 on the substrate 102. The formation method may include forming a first planarization layer PL1 on the substrate 102 to cover the first light emitting diodes LD1, and then as shown in FIG. 4, performing a patterning process to the first planarization layer PL1 for removing a portion of the first planarization layer PL1 to form the accommodating holes AH in the first planarization layer PL1, which is respectively located at a side of the first light emitting diode LD1 in the first lighting unit 104a and the first lighting unit 104b. Each accommodating hole AH is adjacent to and separated from the first light emitting diode LD1 in the same lighting unit 104, that is, the accommodating hole AH and the corresponding first light emitting diode LD1 have a separation distance SP1. In this patterning process, the through holes TH1, the through holes TH2, the through holes TH3, and the through holes TH4 can also be formed in the first planarization layer PL1 at the same time. The through holes TH3 and through holes TH4 can also pass through the third insulation layer 118, exposing the drain electrodes DE of the thin film transistors TFT and the connection electrodes CP.

Then, referring to FIG. 5, a conductive layer may be selectively formed, for example, a third conductive layer ML3. A portion of the third conductive layer ML3 is formed on the surface of the first planarization layer PL1, and another portion of the third conductive layer ML3 is filled in the through holes TH1, the through holes TH2, the through holes TH3, and the through holes TH4. The formed third conductive layer ML3 constitutes a first conductive line CL1 and a second conductive line CL2 in each light unit 104. The first conductive line CL1 is electrically connected to the drain electrode DE, and the second conductive line CL2 is electrically connected to the common electrode line CM via the connection electrode CP. After the first conductive lines CL1 and the second conductive lines CL2 are formed, the preliminary fabrication of the lighting device 100 of the present disclosure is completed. Then, a testing procedure can be performed to the lighting device 100 to test the light-emitting effect of each first light emitting diode LD1 to find out whether the first light emitting diodes LD1 are abnormal (for example, abnormal light emission). When the first light emitting diode LD1 in one or more lighting units 104 is found that the light-emitting effect is not as expected or is abnormal (such as abnormal light emission), a repairing process can be carried out to the corresponding lighting units 104. The repairing process includes disposing the second light emitting diode LD2 in the accommodating holes AH of these lighting units 104. FIG. 5 is an example in which a defect of the first light emitting diode LD1 in the lighting unit 104b is detected. According to the present disclosure, the repairing process includes disposing a second light emitting diode LD2 in the accommodating hole AH of the lighting unit 104b, wherein the disposing method can be similar to the first light emitting diodes LD1. For example, the formed light emitting diodes LD2 can be transferred and fixed in the accommodating holes AH of the lighting units 104 needed to be repaired at the same time or sequentially, and the second light emitting diodes LD2 can be fixed by using an adhesive layer for instance. Next, a second planarization layer PL2 is formed on the substrate 102, covering the second light emitting diodes LD2 and the first planarization layer PL1 and filling in the accommodating hole AH of each lighting unit 104, wherein the second planarization layer PL2 also covers the first planarization layer PL1. The second planarization layer PL2 can be used as a protective layer.

The manufacturing method of the lighting device of the present disclosure may further include the step of forming repairing lines, so as to electrically connecting the second light emitting diode LD2 and the circuit layer 110 by using the repairing lines. Referring to FIG. 6, the step of forming the repairing lines may include performing a patterning process of the second planarization layer PL2 to simultaneously form the through holes th1, the through holes th2, the through hole th3, and the through hole th4 in the lighting unit 104a and the lighting unit 104b, where through hole th1. The through holes th1 and through holes th2 extend in the second planarization layer PL2 in the accommodating hole AH along the direction Dz. The through hole th1 and the through hole th2 in the lighting unit 104a have approximately the same depth, and have a spacing SP2 from the bottom surface of the accommodating hole AH. The through hole th1 and the through hole th2 in the lighting unit 104b respectively expose the first electrode ce1 and the second electrode ce2 of the second light emitting diode LD2. When patterning the second planarization layer PL2, the first electrode ce1 and the second electrode ce2 can serve as an etching stop layer in the etching process of the through hole th1 and the through hole th2. On the other hand, the through holes th3 expose a portion of the first conductive lines CL1, and the through holes th4 may extend to the surface of the third insulating layer 118 to expose the connection electrodes CP. In some embodiments, the maximum width Wt1 of the through holes th1 and the through holes th2 is greater than the maximum width Wt2 of the through holes th3. In other words, when performing the lithography and etching process or patterning process, it is predetermined that the top dimensions of the through holes th1 and the through holes th2 are greater than the top dimensions of the through holes th3. The through holes th1 and the through holes th2 having a larger width Wt1 are designed for reducing the aspect ratio because their depth is deeper, thereby improving the hole filling effect of the subsequent conductive layer. For example, the maximum width Wt1 of the through holes th1 is greater than or equal to about 2 micrometers (μm) and to less than or equal to about 10 micrometers (μm), and the maximum width Wt2 of the through holes th3 is greater than or equal to about 1 micrometer (μm) to less than or equal to about 5 micrometers (μm), but not limited thereto. In this embodiment, the dimension of the through holes th4 may also be similar to the through holes th1 and the through holes th2, but it is not limited thereto.

Next, referring to FIG. 2, a conductive layer is formed, for example, a fourth conductive layer ML4 is formed on a portion of the surface of the second planarization layer PL2 and filled in the through holes th1, the through holes th2, the through holes th3, and the through holes th4 to form a first repairing line RL1 and a second repairing line RL2. The first repairing line RL1 may be directly connected to the first conductive line CL1, and the second repairing line RL2 may be directly connected to the connection electrode CP adjacent to the accommodating hole AH. Since the second light emitting diode LD2 is provided in the lighting unit 104b, the first repairing line RL1 can be directly connected to the first electrode ce1 of the second light emitting diode LD2 so that the second light emitting diode LD2 is electrically connected to the first conductive line CL1, and the second repairing line RL2 can be directly connected to the second electrode ce2 of the second light emitting diode LD2 so that the second light emitting diode LD2 is electrically connected to the connection electrode CP adjacent to the accommodating hole AH and the common electrode line CM. It should be noted that the extension lengths of the first repairing line RL1 and the second repairing line RL2 in the accommodating hole AH of the lighting unit 104a may be approximately the same, and may be longer than the extension length of the first repairing line RL1 and the second repairing line RL2 in the accommodating hole AH of the lighting unit 104b. In addition, the manufacturing method of the lighting device of the present disclosure may further include an electrical isolation process (open process) CT to electrically isolate the defective first light emitting diode LD1 from the circuit layer 110, which means least one of the first electrode CE1 and the second electrode CE2 of the defective first light emitting diode LD1 is electrically isolated from the corresponding thin film transistor TFT or the corresponding common electrode line CM. For example, a laser cutting process may be performed to cut off the first conductive line CL1 between the first light emitting diode LD1 and the thin film transistor TFT in the lighting unit 104b so as to form a disconnection. Alternatively, a laser cutting process may be performed to cut off the second conductive line CL2 so as to form a disconnection between the second electrode CE2 and the common electrode line CM. The electrical isolation process CT can be performed after the testing procedure and before forming the second light emitting diode LD2, after the second light emitting diode LD2 is formed and before forming the second planarization layer PL2, or before or after the repairing line is formed.

The lighting device and the related manufacturing method of the present disclosure are not limited by the aforementioned embodiment, and may have other different embodiments and variant embodiments. To simplify the description, the identical components in each of the following embodiments and variant embodiments are marked with identical symbols. For making it easier to compare the difference between the embodiments and variant embodiments), the following description will detail the dissimilarities among different embodiments (and variant embodiments and the identical features will not be redundantly described. In addition, the material and thickness of each film layer and the conditions of the process steps in the subsequent embodiments of the present disclosure can refer to the first embodiment, and will not be described again.

Figure 8:
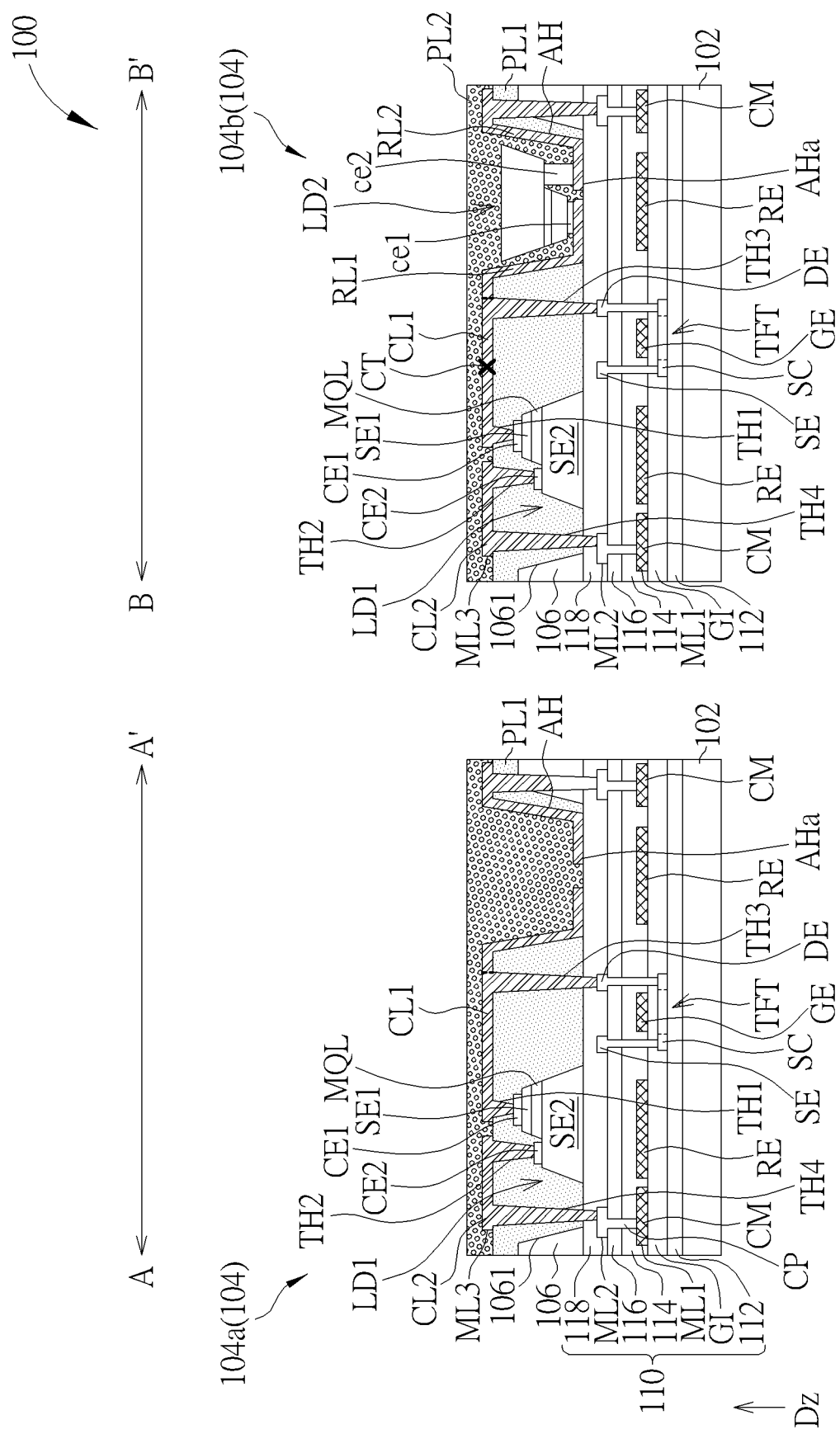
FIG. 8 is a schematic partial cross-sectional view of a lighting device according to a first variant embodiment of the first embodiment of the present disclosure.

Please refer to FIG. 8. FIG. 8 is a schematic partial cross-sectional view of a lighting device according to a first variant embodiment of the first embodiment of the present disclosure, where the lighting unit 104a and the lighting unit 104b in FIG. 8 correspond to the lighting unit 104a and the lighting unit 104b marked with the sectional-line A-A' and sectional-line B-B' in FIG. 1, respectively. The lighting unit 104a and the lighting unit 104b in FIG. 9, FIG.10, and FIG. 15 have similar correspondences, and will not be described again. In this variant embodiment, the first repairing line RL1 and the second repairing line RL2 may be composed of the third conductive layer ML3, which means the first repairing line RL1, the second repairing line RL2, the first conductive line CL1, and the second conductive line CL2 may be formed of the same conductive layer. The first repairing line RL1 and the second repairing line RL2 may extend from the surface of the first planarization layer PL1 along the sidewall of the accommodating hole AH to the bottom surface AHa of the accommodating hole AH. Furthermore, the second light emitting diode LD2 of this variant embodiment is a flip-chip type light emitting diode, and the first electrode ce1 and the second electrode ce2 are both located at the lower surface of the second light emitting diode LD2. When the second light emitting diode LD2 is disposed in the accommodating hole AH, the first electrode ce1 and the second electrode ce2 of the second light emitting diode LD2 can directly contact and/or electrically connected to the first repairing line RL1 and the second repairing lines RL2 respectively. The second planarization layer PL2 shown in FIG. 8 covers the first repairing line RL1 and the second repairing line RL2, and the variant embodiment may not include the protective layer 120 shown in FIG. 2. In this variant embodiment, an electrical isolation process CT can be performed to the defective or damaged first light emitting element LD1. For example, the first conductive line CL1 in the lighting unit 104b can be cut off by a laser process, so that the first light emitting element LD1 and the thin film transistor TFT are electrically isolated. The other embodiments of the present disclosure can perform similar electrical isolation process CT or electrical isolation processes to the defective first light emitting diode LD1 or damaged parts, and will not be described again.

Figure 9:
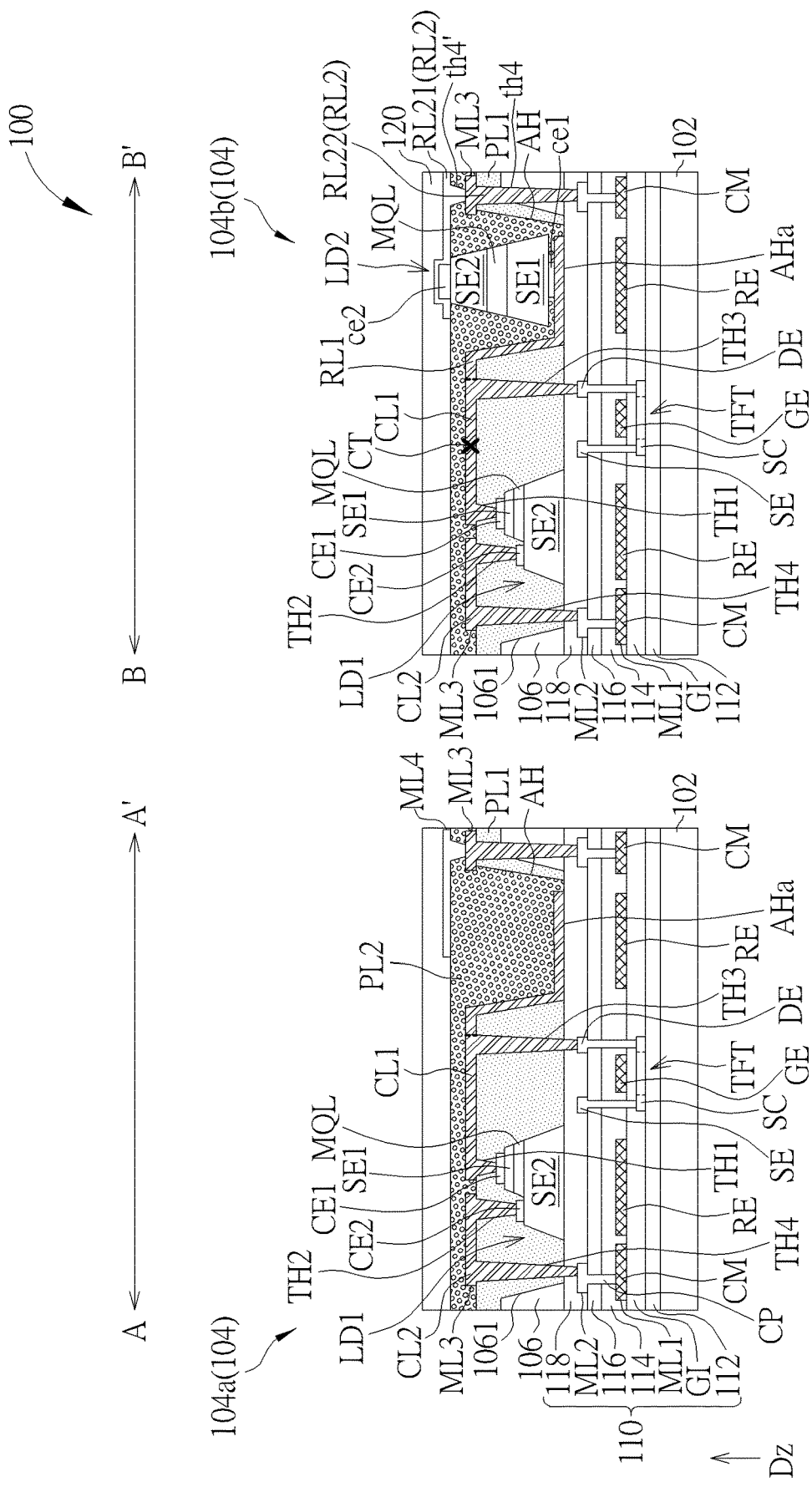
FIG. 9 is a schematic partial cross-sectional view of alighting device according to a second variant embodiment of the first embodiment of the present disclosure.

Please refer to FIG. 9, which is a schematic partial cross-sectional view of a lighting device according to a second variant embodiment of the first embodiment of the present disclosure. In this variant embodiment, the second light emitting diode LD2 is a vertical type light emitting diode, and the first electrode ce1 and the second electrode ce2 thereof are respectively located at the lower side and upper side of the second light emitting diode LD2. The first repairing line RL1 may be composed of the third conductive layer ML3, and extends from an upper surface of the first planarization layer PL1 along the sidewall of the accommodating hole AH to a bottom surface AHa of the accommodating hole AH. The second repairing line RL2 may include a first portion RL21 and a second portion RL22. The second portion RL22 may be composed of the third conductive layer ML3, penetrating the first planarization layer PL1, the pixel defining layer 106, and the third insulating layer 118 through the through hole th4 to be electrically connected to the common electrode line CM. The first portion RL21 of the second repairing line RL2 may be composed of another conductive layer, for example, a fourth conductive layer ML4, which is located above the second planarization layer PL2 and covers and contacts the second electrode ce2 of the second light emitting diode LD2. The first portion RL21 can further be connected to the second portion RL22 through the through hole th4'. It can be known from the foregoing that the second repairing line RL2 and the first repairing line RL1 may be composed of non-identical or different conductive layers. For example, the first repairing line RL1 is composed of one conductive layer and the second repairing line RL2 is composed of two conductive layers, but not limited thereto. In this variant embodiment, a protective layer 120 may be disposed on the second planarization layer PL2 and the fourth conductive layer ML4.

Figure 10:
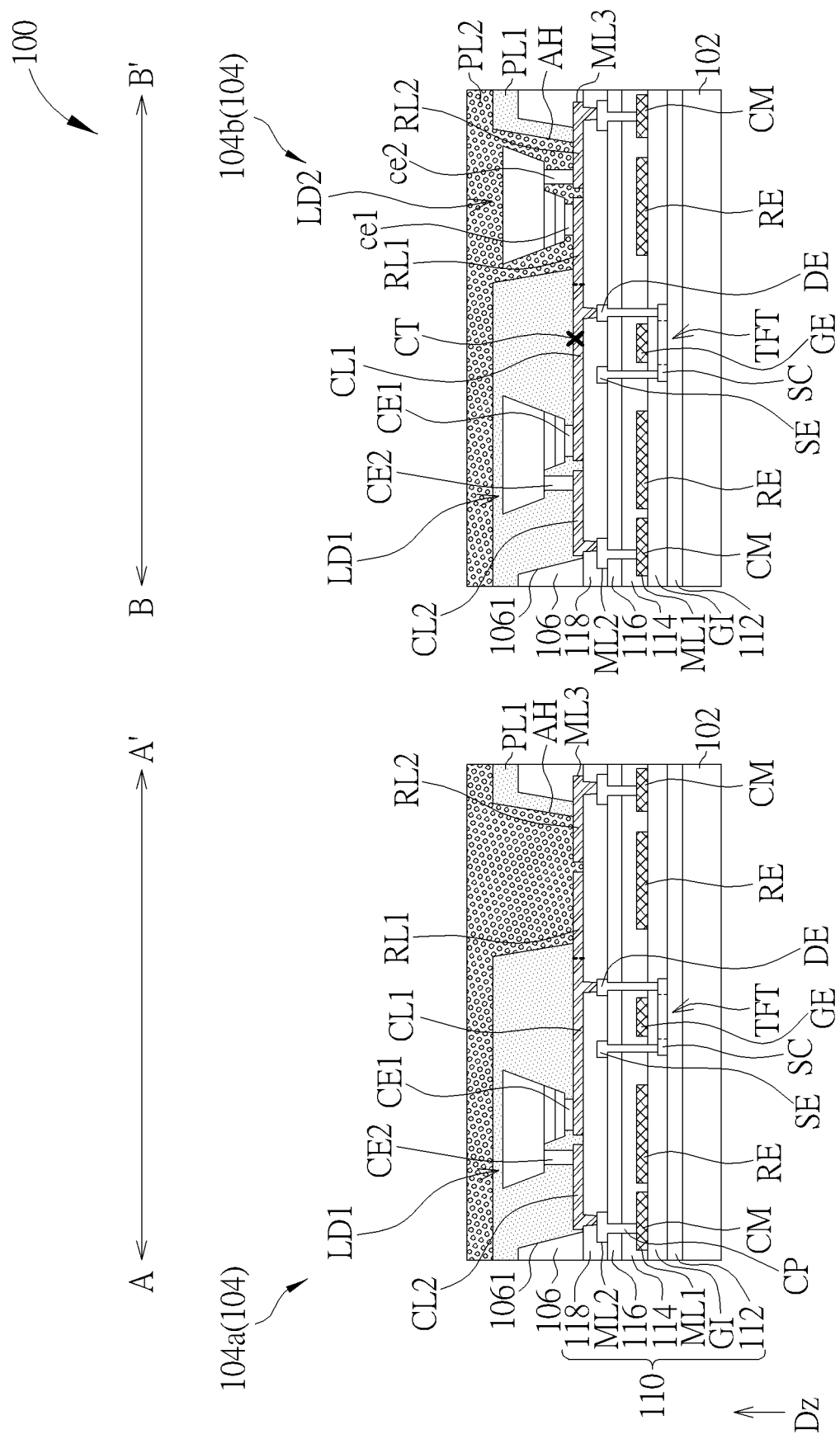
FIG. 10 is a schematic partial cross-sectional view of a lighting device according to a third variant embodiment of the first embodiment of the present disclosure.

Please refer to FIG. 10, which is a schematic partial cross-sectional view of a lighting device according to a third variant embodiment of the first embodiment of the present disclosure. Compared with the first variant embodiment shown in FIG. 8, the first light emitting diode LD1 and the second light emitting diode LD2 of this variant embodiment are both flip-chip type light emitting diodes. The first electrode CE1 and the second electrode CE2 of the first light emitting diode LD1 both face the substrate 102 and are in contact with and electrically connected with the first conductive line CL1 and the second conductive line CL2 therebelow. Similarly, the first electrode ce1 and the second electrode ce2 of the second light emitting diode LD2 face the substrate 102 and are in contact with and electrically connected to the first repairing line RL1 and the second repairing line RL2 therebelow. In this variant embodiment, the first conductive line CL1, the second conductive line CL2, the first repairing line RL1, and the second repairing line RL2 may be composed of the same conductive layer, such as the third conductive layer ML3, wherein the third conductive layer ML3 may be disposed between the pixel defining layer 106 and the circuit layer 110, or may be disposed between the first planarization layer PL1 and the circuit layer 110, but is not limited thereto.

Figure 11:
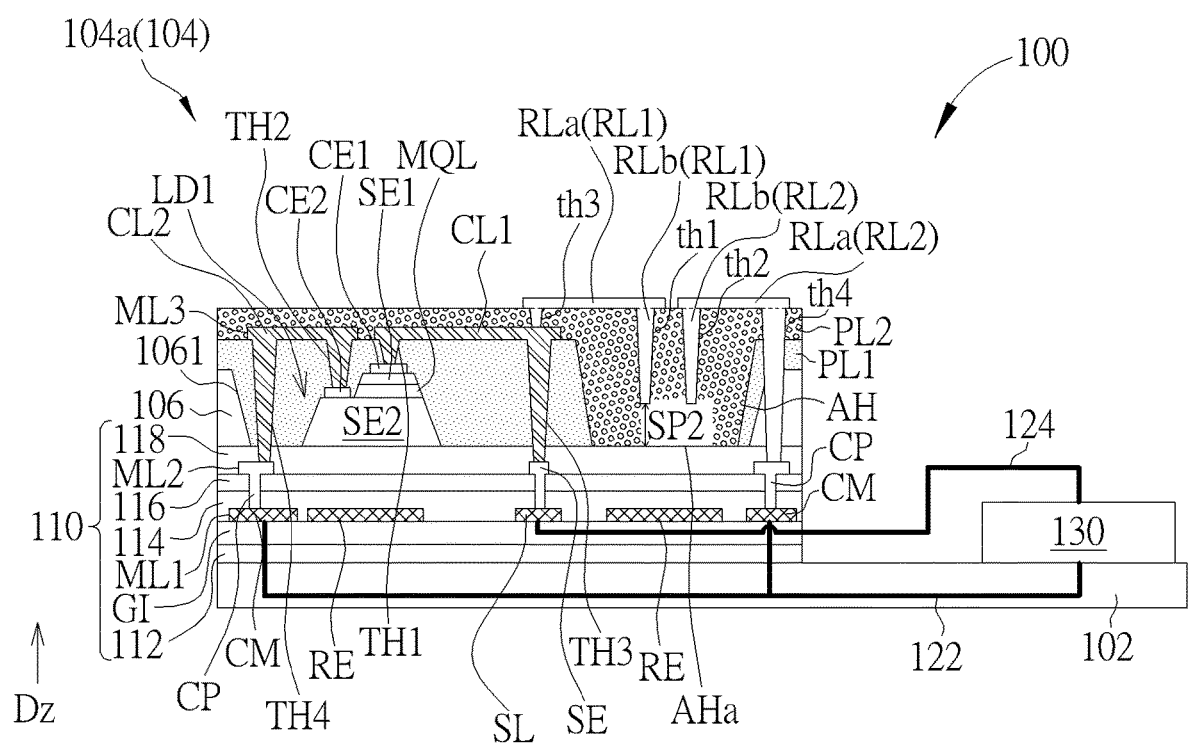
FIG. 11 is a schematic partial cross-sectional view of a lighting device according to a second embodiment of the present disclosure.

Please refer to FIG. 11, which is a schematic partial cross-sectional view of a lighting device according to a second embodiment of the present disclosure. In this embodiment, the lighting device 100 may be a passive lighting device, and each lighting unit 104 may have a corresponding driving element or switching element (such as a thin film transistor) disposed in the circuit layer 110. For example, the circuit layer 110 may include a common electrode line CM and a signal line SL. A chip 130 may be disposed on the surface of the substrate 102, and the common electrode line CM and the signal line SL may be electrically connected to the chip 130 respectively. An equivalent circuit line 122 and an equivalent circuit line 124 in FIG. 11 indicate the electrical connection relationship between the common electrode line CM or the signal conductive line SL and the chip 130. When the lighting device 100 is in an operating state, the chip 130 can provide a signal (such as a switching signal) required for the operation of the first light emitting diode LD1, and the first light emitting diode LD1 may be turned on by transmitting the signal through the signal line SL.

Figure 12:
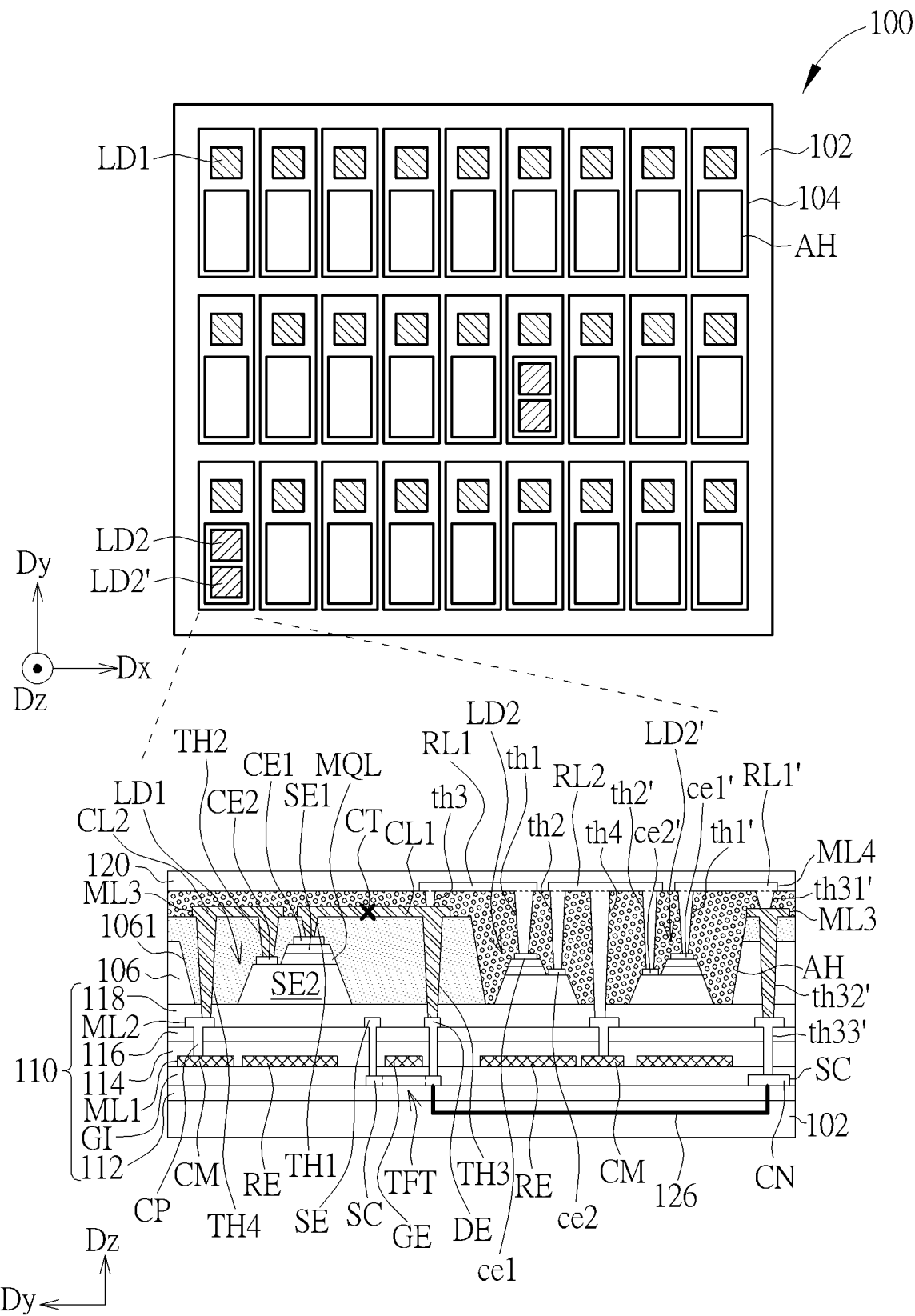
FIG. 12 illustrates a schematic top view of a lighting device according to a third embodiment of the present disclosure.

Please refer to FIG. 12. FIG. 12 is a schematic top view of a lighting device according to a third embodiment of the present disclosure, and an enlarged cross-sectional view of one of the lighting units is shown below in the FIG. 12. In this embodiment, when the first light emitting diode LD1 in one lighting unit 104 emits light abnormally or is defective, two second light emitting diodes LD2 and LD2' may be disposed in the same accommodating hole AH. The first repairing line RL can electrically connect the first electrode ce1 of the second light emitting diode LD2 and the drain electrode DE of the thin film transistor LD through the through hole th1 and the through hole th3, and the first repairing line RL' is electrically connected to the first electrode ce1' of the second light emitting diode LD2' through the through hole th1' and further electrically connects the first electrode ce1' of the diode LD2' and the connection line CN via the through hole th31', the through hole th32' and the through hole th33', wherein the connection line CN is electrically connected to the drain DE of the thin film transistor TFT, and the electrically connection relationship between the connection line CN and the drain DE is represented by an equivalent circuit line 126 in FIG. 12. The connection line CN may include the semiconductor layer SC, but is not limited thereto. In some embodiments, the connection line CN may be formed of the first conductive layer ML1. Furthermore, the second light emitting diode LD2 and the second light emitting diode LD2' can have the common second conductive line RL2 to be electrically connected to the common electrode line CM, wherein the second conductive line RL2 electrically connects the second electrode ce2 of the second light-emitting diode LD2 and the common electrode line CM by passing through the through hole th2 and the through hole th4, and electrically connect the second electrode ce2' of the second light emitting diode LD2' and the common electrode line CM through the through hole th2' and the through hole th4, wherein the through hole th4 may penetrate the second planarization layer PL2.

In this embodiment, one accommodating hole AH may be provided with two second light emitting diodes LD2 and LD2', and the sizes of the second light emitting diodes LD2 and LD2' may be the same as or different from the first light emitting diode LD1. By using the two second light emitting diodes LD2 and LD2', the same or different repair functions can be provided, and the probability of failure to successfully repair the light unit 104 resulted from that the two second light emitting diodes LD2 and LD2' are both defective can be reduced. The size of the accommodating hole AH in this embodiment is larger than the accommodating hole AH of the previous embodiments, and the accommodating hole AH shown in FIG. 12 may be composed of the pixel defining layer 106 and the first planarization layer PL1, which means the sidewall of the accommodating hole AH includes a portion of the pixel defining layer 106 and a portion of the first planarization layer PL1, but it is not limited thereto. In some embodiments, the accommodating hole AH may still be composed of the first planarization layer PL1, thus the accommodating hole AH will not expose the pixel defining layer 106, and the first planarization layer PL1 will cover the sidewall of the opening 1061 of the pixel defining layer 106. Similar to the foregoing embodiments, an electrical isolation process CT can be performed in this embodiment to cut off the electrical connection between the first light emitting diode LD1 and the thin film transistor TFT. In some embodiments, when a second light emitting diode LD2 or a second light emitting diode LD2' can achieve the repairing purpose, one of the second light emitting diodes LD2 and LD2' may be electrically isolated from the thin film transistor TFT, but not limited thereto.

Figure 13:
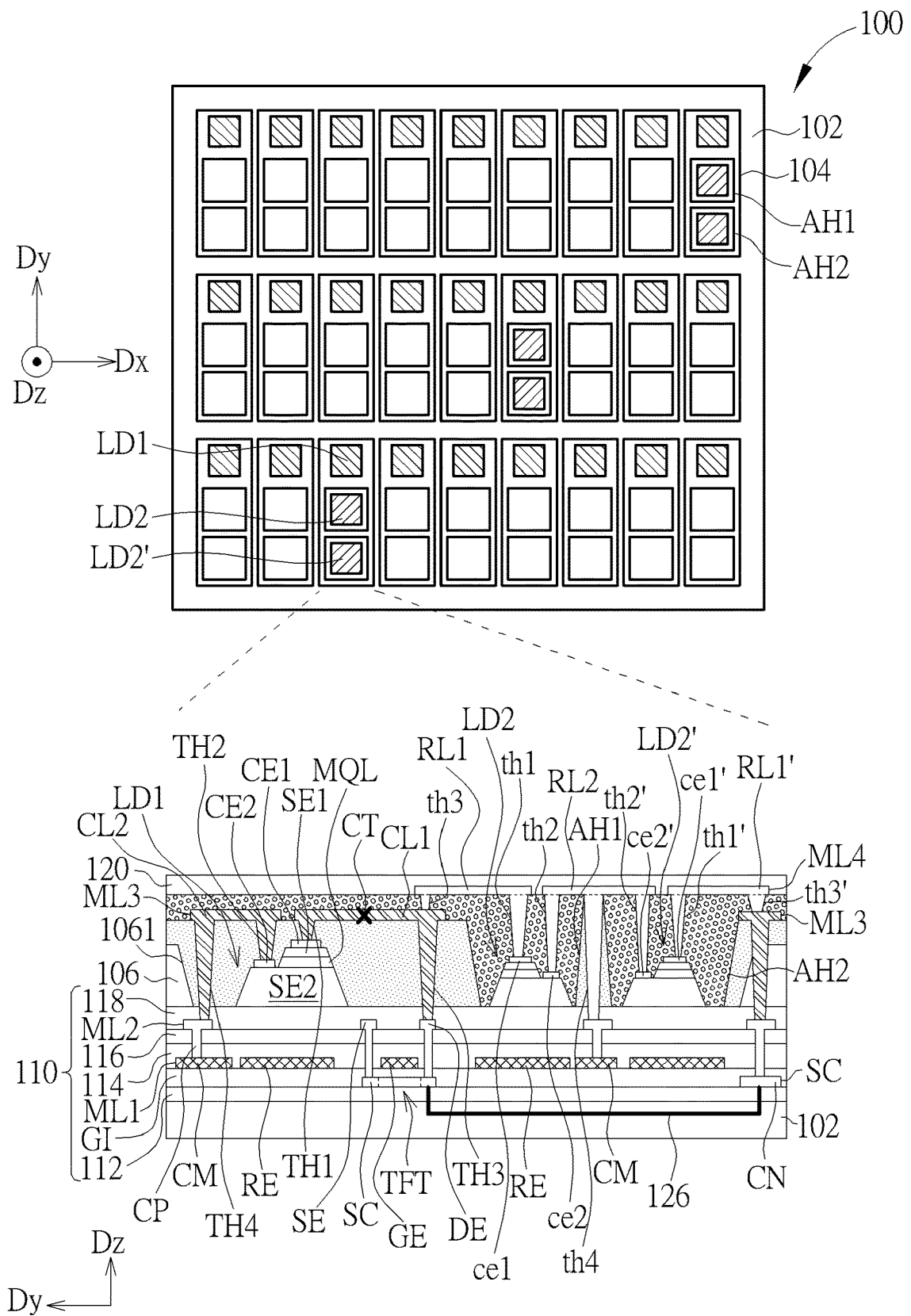
FIG. 13 illustrates a schematic top view of a lighting device according to a fourth embodiment of the present disclosure.

Please refer to FIG. 13, which is a schematic top view of a lighting device according to a fourth embodiment of the present disclosure, and an enlarged cross-sectional view of one of the lighting units is shown below in the FIG. 13. The difference between this embodiment and the third embodiment is that the lighting unit 104 in FIG. 13 includes two accommodating holes AH1 and AH2. When the first light emitting diode LD1 of the lighting unit 104 is defective, a second light emitting diode LD2 and a second light emitting diode LD2' can be respectively disposed in the accommodating hole AH1 and the accommodating hole AH2. The second light emitting diode LD2 and the second light emitting diode LD2' may share the second repairing line RL2, wherein the second repairing line RL2 can be electrically connected to the common electrode line CM through the through hole th4, and the through hole th4 in FIG. 13 can pass through the first A planarization layer PL1. The electrical connections of the second light emitting diode LD2 and the second light emitting diode LD2' with other elements may be similar to that of the third embodiment, and details are not described repeatedly.

Figure 14:
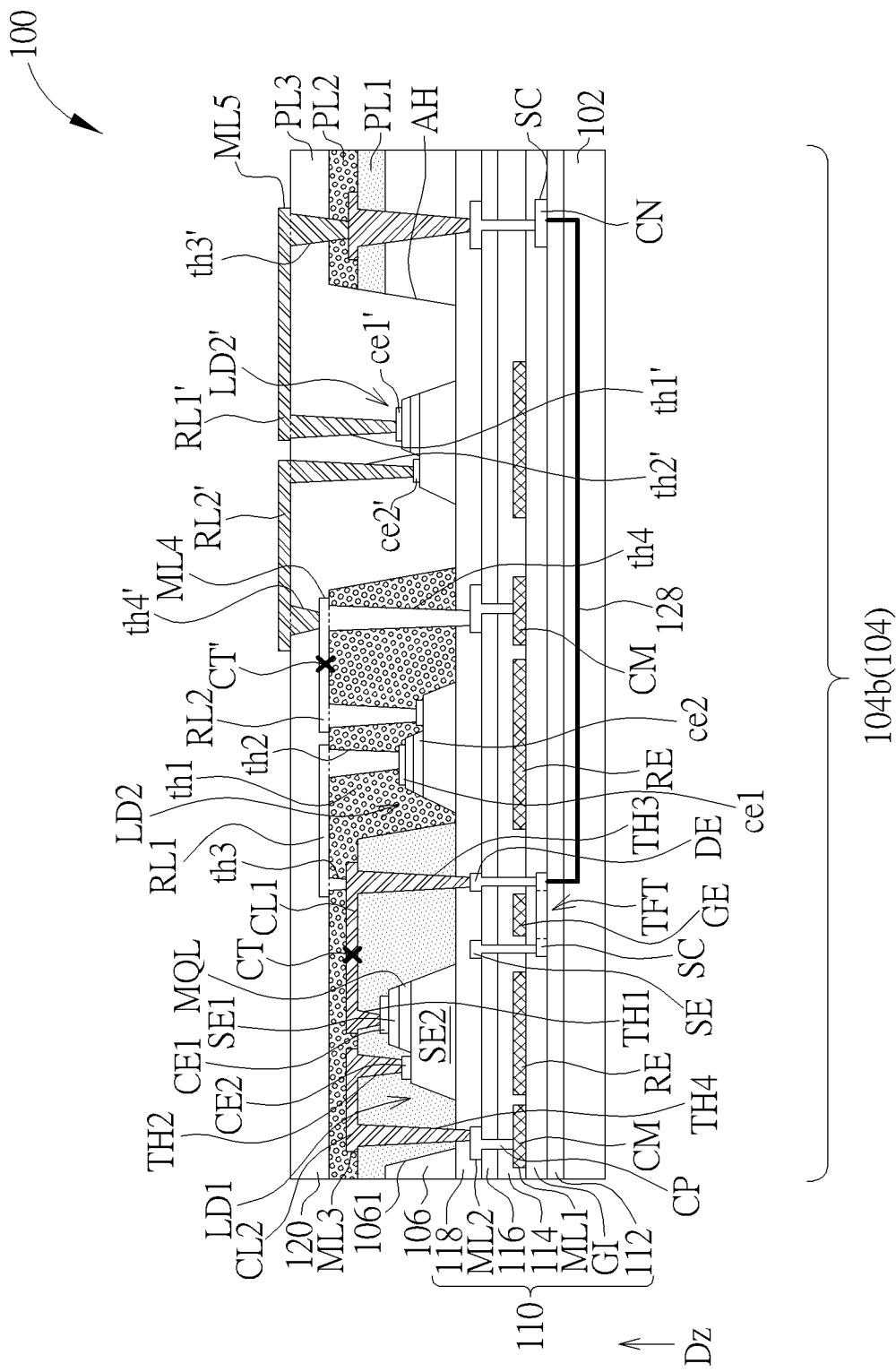
FIG. 14 is a schematic partial cross-sectional view illustrating a lighting device and related manufacturing method according to a fifth embodiment of the present disclosure.

Please refer to FIG. 14, which is a schematic partial cross-sectional top view of a lighting device and related manufacturing method according to a fifth embodiment of the present disclosure. In the lighting unit 104 of the lighting device 100 in this embodiment, the accommodating hole AH may have a larger size, and the accommodating hole AH may be composed of a portion of the pixel defining layer 106, a portion of the first planarization layer PL1, and a portion of the second planarization layer PL2. In the manufacturing process of the lighting device 100, if a defective first light emitting diode LD1 of the lighting unit 104b is detected, a second light emitting diode LD2 can be disposed in the accommodating hole AH, and an electrical isolation process (or called open process) CT can be performed to the first light emitting diode LD1. Then, the testing procedure can be performed again to test the light-emitting effect of the second light emitting diode LD2. If an abnormal status of the second light emitting diode LD2 occurs, another second light emitting diode LD2' (or may be referred to as a third light emitting diode) can be further disposed in the accommodating hole AH and the electrical isolation process CT' can be performed again to electrically isolate the second light emitting diode LD2 from the thin film transistor TFT or the common electrode line CM. After the second light emitting diode LD2' is fabricated, a third planarization layer PL3 can be formed on the substrate 102 to cover the second light emitting diode LD2', and then a conductive layer can be formed on the third planarization layer PL3, such as the fifth conductive layer ML5, by filling a portion of the fifth conductive layer ML5 in the through hole th1' and through hole th3' to form the first repairing line RL1', and filling a portion of the fifth conductive layer ML5 in the through hole th2' and through hole th4' to form the second repairing line RL2'. The lighting device 100 may further include a protective layer covering on the fifth conductive layer ML5 and the third planarization layer PL3 to provide a protection function for the light emitting diodes.

Figure 15:
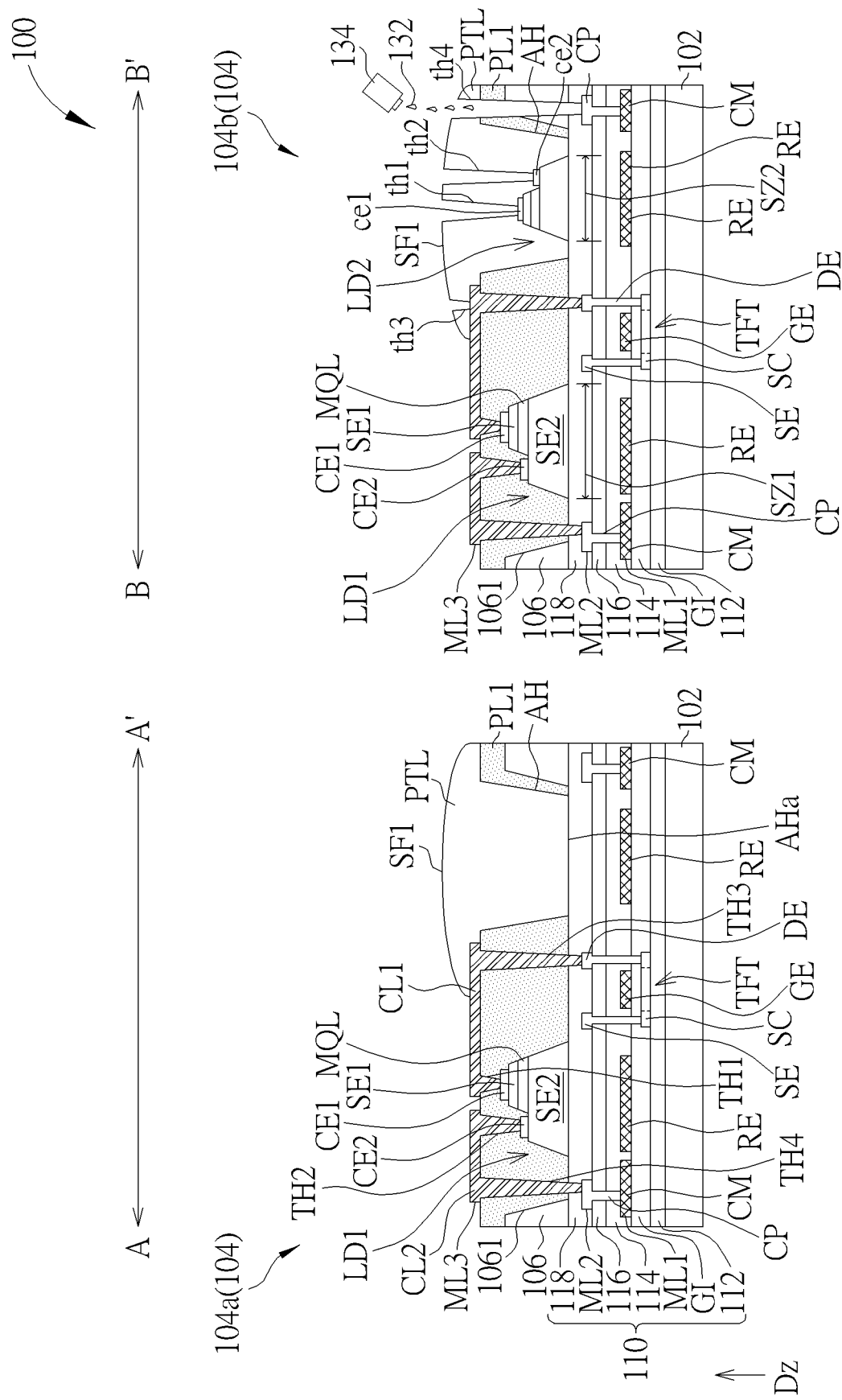
FIG. 15 to FIG. 16 are schematic process diagrams illustrating a lighting device and related manufacturing method according to a sixth embodiment of the present disclosure.
Figure 16:
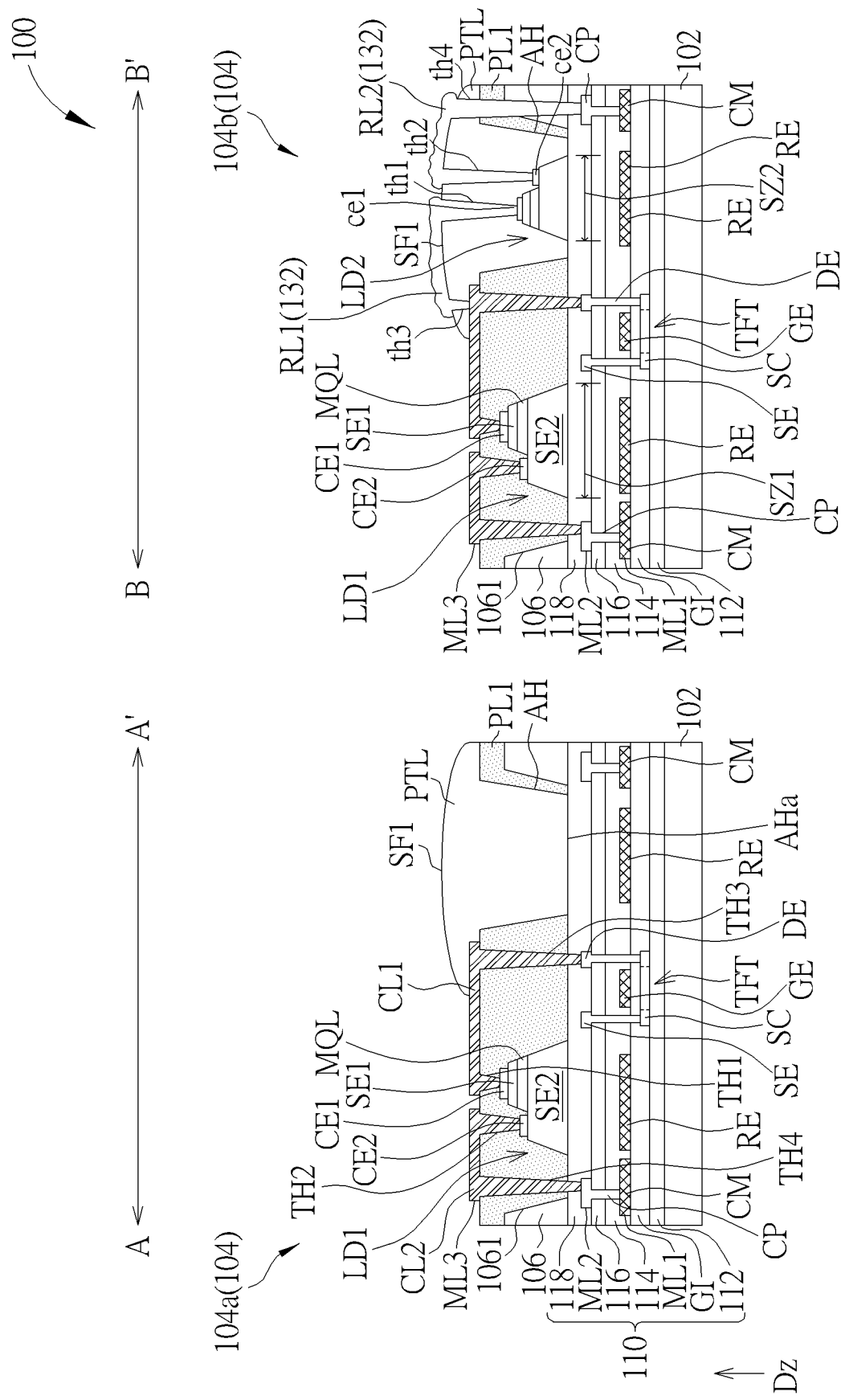

Please refer to FIG. 15 to FIG. 16. FIG. 15 to FIG. 16 are schematic process diagrams of a lighting device and related manufacturing method according to a sixth embodiment of the present disclosure. Referring to FIG. 15, compared with the first embodiment, the lighting device 100 of this embodiment uses an encapsulating layer PTL instead of the second planarization layer PL2. The encapsulating layer PTL can be formed at the accommodating hole AH by dispensing, and therefore the encapsulating layer PTL may not cover the first light emitting diode LD1. The manufacturing method of the lighting device 100 of this embodiment includes that after the first light emitting diode PD1, the first conductive line CL1, and the second conductive line CL2 are fabricated, a testing procedure is performed to find out that the first light emitting diode LD1 of the lighting unit 104b is abnormal, and the first light emitting diode LD1 of the lighting unit 104a has no abnormal appearance, for instance. Next, a second light emitting diode LD2 is disposed in the accommodating hole AH of the lighting unit 104b, and then an encapsulating layer PTL is formed. The manufacturing method of this embodiment is to perform a repairing process for the abnormal lighting unit 104b to form a repairing line. For example, a laser process or an etching process is used to form the through hole th1, the through hole th2, the through hole th3, and the through hole th4 in the encapsulating layer PTL of the lighting unit 104b, and then a conductive paste process (illustrated by the nozzle 134 in the figure) can be used to inject conductive adhesive 132 into through hole th1, the through hole th2, the through hole th3, and the through hole th4 to form a first repairing line RL1 and a second repairing line RL2, as shown in FIG. 16. The conductive adhesive 132 may be, for example, a silver paste. According to this embodiment, the first repairing line RL1 and the second repairing line RL2 will not be formed in the accommodating hole AH of the lighting unit 104a without abnormality, and there will be no through hole in the lighting unit 104a, but not limited thereto.

Figure 17:
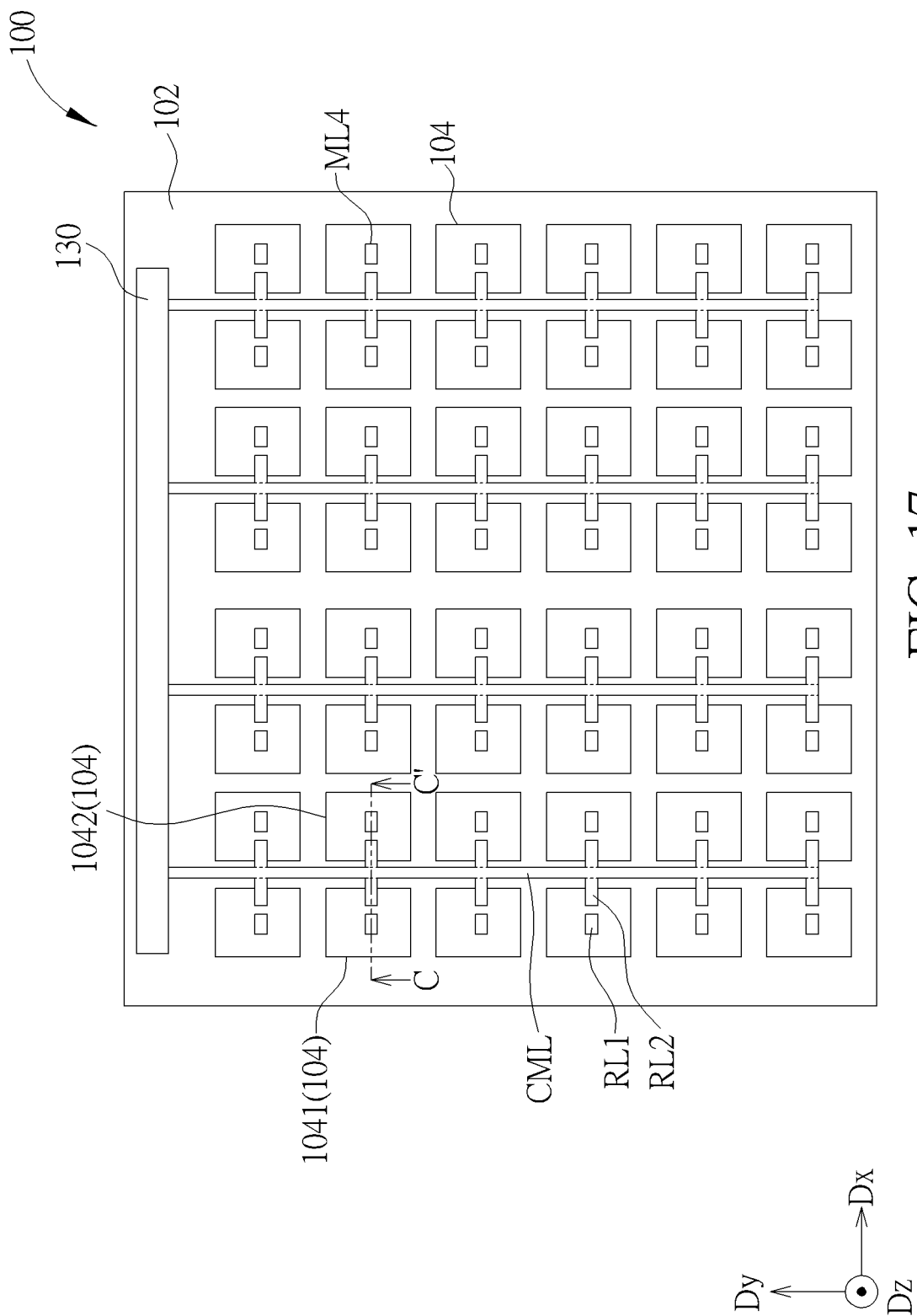
FIG. 17 is a schematic top view of a lighting device according to a seventh embodiment of the present disclosure.
Figure 18:
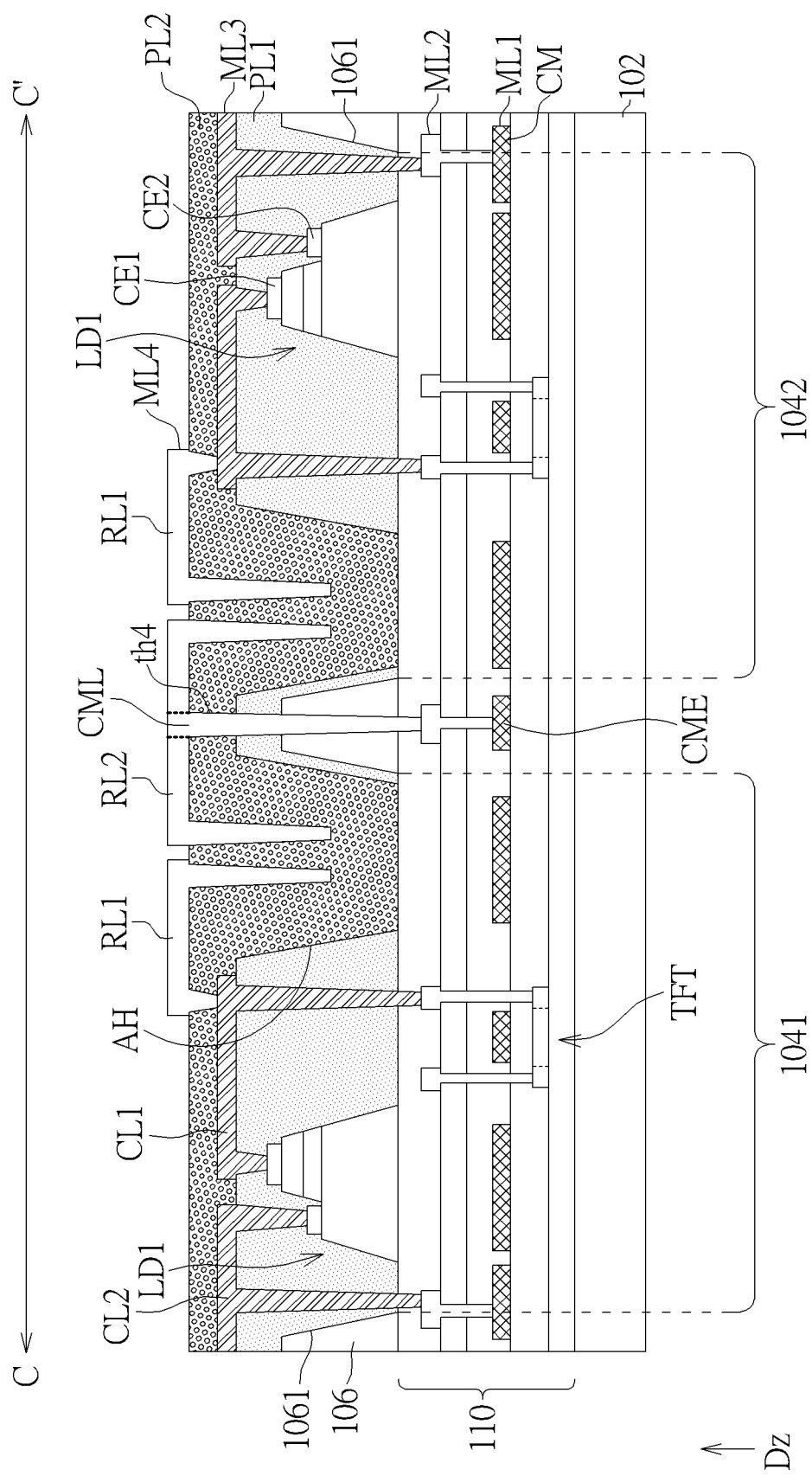
FIG. 18 is a schematic partial cross-sectional view of the lighting device along a sectional line C-C' shown in FIG. 17.

Please refer to FIG. 17 to FIG. 18. FIG. 17 is a schematic top view of a lighting device according to a seventh embodiment of the present disclosure, and FIG. 18 is a schematic partial cross-sectional view of the lighting device along a sectional line C-C' shown in FIG. 17. The lighting device 100 of this embodiment uses the fourth conductive layer ML4 to form the common electrode lines CML. One common electrode line CML may be located between adjacent lighting units 104 and extend along a direction (for example, direction Dy) to be connected to the chip 130. Taking the adjacent lighting unit 1041 and the lighting unit 1042 as an example, the second repairing line RL2 therein can be directly connected to the common electrode line CML between the two lighting units, and the chip 130 can provide a common electrode signal through the common electrode line CML. In FIG. 18, a portion of the common electrode line CML may be electrically connected to the common electrode CME through the through hole th4, but not limited thereto. In some embodiments, the lighting device 100 may have a touch-control function or sensing function, and may provide a common signal and a touch or sensing signal according to different timing sequences via the common electrode line CML and/or the common electrode line CM. For example, during the time sequence of display operation, the common electrode line CML and/or the common electrode line CM will generally provide a continuous common signal to the second electrode CE2 of the first light emitting diode LD1, and during the time sequence of touch or sensing operation, the chip 130 can provide touch signals or sensing signals of different timing sequences to the common electrode lines CML and/or the common electrode lines CM in different regions to switch on or switch off the touch or sensing unit in each region, such as providing touch signals with a frequency above 60 Hz. Under this design, the common electrode lines CML and/or the common electrode lines CM can be utilized to achieve both the display function and the touch or sensing function.

The lighting device provided by the present disclosure may include more than one lighting unit, and the lighting unit has a first light emitting diode and an accommodating hole, wherein the accommodating hole is used to reserve for disposing a second light emitting diode for repair. In some embodiments, the repairing lines can be formed in each lighting unit at the same time in the circuit array manufacturing method. Accordingly, although in some lighting units, second light emitting diodes are not provided in the accommodating holes thereof, there will still be repairing lines near their accommodating holes. By forming the second light emitting diodes and the repairing lines according to the manufacturing method of the lighting device of the present disclosure, the manufacturing yield can be improved while the process efficiency can be maintained or the process efficiency can even be raised. In some embodiments, the repairing lines can be separately formed for the abnormal lighting units by a dispensing method. In this case, only a portion of the lighting units may have the repairing lines. In general, according to the spirit of the present disclosure, each lighting unit of the lighting device may include both a first light emitting diode and an accommodating hole for reserving repairing space, but there may be only a small amount of accommodating holes having the second light emitting diodes disposed therein. For example, the number of the second light emitting diodes may be less than or much less than the number of the first light emitting diodes. Furthermore, the accommodating holes in the lighting units can be filled by a planarization layer or an encapsulating material, so that the display device has a relatively flat surface, which is conducive to subsequent processes.

Without departing from the spirit of the present disclosure or without conflict, the features, structures, and method steps in the foregoing embodiments and variant embodiments can be mixed and used arbitrarily.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A lighting device comprising:
   a substrate;
   a pixel defining layer disposed on the substrate, wherein the pixel defining layer includes an opening;
   a first light emitting diode disposed in the opening;
   a first planarization layer disposed on the first light emitting diode and in the opening, wherein the first planarization layer includes an accommodating hole disposed in the opening, and the accommodating hole is separated from the first light emitting diode; and
   a second light emitting diode disposed in the accommodating hole.

2. The lighting device according to claim 1, wherein the second light emitting diode is for repairing the first light emitting diode.

3. The lighting device according to claim 1, wherein the first light emitting diode comprises a first electrode and a second electrode on a top surface thereof.

4. The lighting device according to claim 1, wherein the second light emitting diode is flip-chip type.

5. A method of manufacturing a lighting device, comprising:
   providing a substrate;
   forming a circuit layer on the substrate;
   forming a pixel defining layer on the substrate;
   forming an opening in the pixel defining layer;
   forming a first light emitting diode of a light unit in the opening;
   forming a first planarization layer on the first light emitting diode;
   forming an accommodating hole of the lighting unit, wherein the accommodating hole is separated from the first light emitting diode; and
   forming a second light emitting diode in the accommodating hole.

6. The method of manufacturing the lighting device according to claim 5, further comprising a step of forming a repairing line which electrically connects the second light emitting diode and the circuit layer.

7. The method of manufacturing the lighting device according to claim 6, further comprising:
   forming a second planarization layer on the first planarization layer;
   forming a through hole in the second planarization layer; and
   forming the repairing line to extend into the through hole.

8. The method of manufacturing the lighting device according to claim 5, further comprising:
   electrically isolating the first light emitting diode and the circuit layer.

9. The lighting device according to claim 1, wherein the second light emitting diode is electrically connected to a common electrode line, and the first light emitting diode is electrically isolated from the common electrode line.

10. The lighting device according to claim 1, further comprising a conductive layer, wherein a portion of the conductive layer is formed on a surface of the first planarization layer, and the portion of the conductive layer is electrically connected to the first light emitting diode.

11. The lighting device according to claim 1, further comprising:
    a second polarization layer disposed on the first polarization layer and the second light emitting diode and filled in the accommodating hole; and
    a conductive layer, wherein a portion of the conductive layer is disposed on a surface of the second polarization layer, and the portion of the conductive layer is electrically connected to the second light emitting diode.

* * * * *